(12) United States Patent
Son et al.

(10) Patent No.: US 11,785,171 B2
(45) Date of Patent: *Oct. 10, 2023

(54) DISPLAY DEVICE HAVING AN EMISSION LAYER

(71) Applicant: SAMSUNG DISPLAY CO., LTD., Yongin-si (KR)

(72) Inventors: Se Wan Son, Yongin-si (KR); Wang Woo Lee, Osan-si (KR); Moo Soon Ko, Seoul (KR); Jung Hwa Kim, Gunpo-si (KR); Jin Sung An, Seongnam-si (KR); Ji Seon Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/688,107

(22) Filed: Mar. 7, 2022

(65) Prior Publication Data
US 2022/0201162 A1    Jun. 23, 2022

Related U.S. Application Data

(63) Continuation of application No. 16/983,113, filed on Aug. 3, 2020, now Pat. No. 11,272,078, which is a (Continued)

(30) Foreign Application Priority Data
Feb. 27, 2017   (KR) ........................ 10-2017-0025778

(51) Int. Cl.
*H04N 3/14*    (2006.01)
*H01L 27/15*   (2006.01)
(Continued)

(52) U.S. Cl.
CPC ............. *H04N 3/15* (2013.01); *G09G 3/3266* (2013.01); *G09G 3/3291* (2013.01);
(Continued)

(58) Field of Classification Search
CPC ...... H04N 3/15; G09G 3/3266; G09G 3/3291; G09G 2310/0278; G09G 3/3233;
(Continued)

(56) References Cited

U.S. PATENT DOCUMENTS 9,117,783 B2    8/2015  Jin
9,129,923 B1 *  9/2015  Han ................... H01L 27/3262
(Continued)

FOREIGN PATENT DOCUMENTS

CN    101729488    6/2010
CN    104217675    12/2014
(Continued)

OTHER PUBLICATIONS

European Search Report dated Aug. 16, 2018, of the corresponding European Patent Application No. 18155196.1, 7 pages.

*Primary Examiner* — Abhishek Sarma
(74) *Attorney, Agent, or Firm* — F. Chau & Associates, LLC

(57) ABSTRACT

A display device includes a substrate and an active pattern positioned above the substrate and including a plurality of channel regions and a plurality of conductive regions. The display device includes a plurality of scan lines extending substantially in a first direction. The display device includes a data line and a driving voltage line crossing the plurality of scan lines. The display device includes a first transistor including a first channel region among the plurality of channel regions and a first gate electrode. The display device includes a first connector electrically connecting the first gate electrode of the first transistor and a first conductive (Continued)

region among the plurality of conductive regions to each other. The driving voltage line overlaps at least a portion of the first connector along a direction orthogonal to an upper surface of the substrate.

14 Claims, 30 Drawing Sheets

Related U.S. Application Data continuation of application No. 15/841,943, filed on Dec. 14, 2017, now Pat. No. 10,735,629.

(51) Int. Cl.
*G09G 3/3291* (2016.01)
*G09G 3/3266* (2016.01)
*H01L 27/12* (2006.01)
*H10K 59/131* (2023.01)
*H10K 59/121* (2023.01)

(52) U.S. Cl.
CPC ........ *H01L 27/124* (2013.01); *H01L 27/1222* (2013.01); *H01L 27/1255* (2013.01); *H01L 27/156* (2013.01); *H10K 59/1213* (2023.02); *H10K 59/1216* (2023.02); *H10K 59/131* (2023.02); *G09G 2310/0278* (2013.01)

(58) Field of Classification Search
CPC .............. H01L 27/1222; H01L 27/124; H01L 27/1255; H01L 27/156; H01L 27/3262; H01L 27/3265; H01L 27/3276; H05B 33/10; H05B 33/12

See application file for complete search history.

(56) References Cited

U.S. PATENT DOCUMENTS

| | | | |
|---|---|---|---|
| 9,608,050 | B2 | 3/2017 | Jin |
| 10,522,604 | B2 | 12/2019 | Jin |
| 10,735,629 | B2 | 8/2020 | Son et al. |
| 2003/0218169 | A1 | 11/2003 | Isobe et al. |
| 2014/0299843 | A1 | 10/2014 | Kim |
| 2014/0312326 | A1 | 10/2014 | Moon et al. |
| 2014/0353629 | A1 | 12/2014 | Jin |
| 2015/0015468 | A1* | 1/2015 | Ko ................. G09G 3/3233 345/82 |
| 2015/0130691 | A1 | 5/2015 | Jeon |
| 2015/0137099 | A1 | 5/2015 | Choi |
| 2015/0170563 | A1 | 6/2015 | Bang |
| 2016/0012775 | A1 | 1/2016 | Jeong et al. |
| 2017/0025492 | A1 | 1/2017 | Jung et al. |
| 2018/0249046 | A1 | 8/2018 | Son et al. |
| 2020/0366813 | A1 | 11/2020 | Son et al. |

FOREIGN PATENT DOCUMENTS

| | | |
|---|---|---|
| KR | 100589375 | 6/2006 |
| KR | 1020150105586 | 9/2015 |
| KR | 1020160121745 | 10/2016 |
| KR | 1020160129155 | 11/2016 |

* cited by examiner

DISPLAY DEVICE HAVING AN EMISSION LAYER

CROSS-REFERENCE TO RELATED APPLICATIONS

This application is a continuation of U.S. patent application Ser. No. 16/983,113 filed on Aug. 3, 2020, which is a continuation of U.S. patent application Ser. No. 15/841,943 filed on Dec. 14, 2017, now U.S. Pat. No. 10,735,629 issued on Aug. 4, 2020, which claims priority to Korean Patent Application No. 10-2017-0025778 filed in the Korean Intellectual Property Office on Feb. 27, 2017, the disclosures of which are incorporated by reference herein in their entireties.

(a) TECHNICAL FIELD

Exemplary embodiments of the present invention relate to a display device, and more particularly to a display device including an emission layer.

(b) DISCUSSION OF RELATED ART

A display device may display an image and may include a plurality of pixels. As an example, the pixel of an organic light emitting diode display may include a light emitting diode having a cathode, an anode, and an organic emission layer, and a plurality of transistors and at least one capacitor for driving the light emitting diode.

The light emitting diode may include two electrodes and an organic emission layer disposed therebetween. Electrons injected from the cathode as one electrode of two electrodes and holes injected from the anode as the other electrode may be combined in the organic emission layer form excitons, thus emitting light when the excitons emit energy.

The plurality of transistors may include at least one switching transistor and at least one driving transistor. The switching element may receive a data signal depending on a scan signal and may transmit a voltage depending thereon to the data signal. The driving transistor may be directly or indirectly connected to the light emitting diode to control an amount of a current transmitted to the light emitting diode, thus emitting light of a desired luminance by each pixel.

The capacitor may be connected to a driving gate electrode of the driving transistor, thus maintaining a voltage of the driving gate electrode.

SUMMARY

A capacitance of a capacitor connected to a driving gate electrode of a display device according to an exemplary embodiment of the present invention may stably maintain a voltage of the driving gate electrode, thus reducing or eliminating display quality defects such as a color deviation between the pixels, or crosstalk.

A display device according to an exemplary embodiment includes a substrate and an active pattern positioned above the substrate and including a plurality of channel regions and a plurality of conductive regions. The display device includes a plurality of scan lines extending substantially in a first direction. The display device includes a data line and a driving voltage line crossing the plurality of scan lines. The display device includes a first transistor including a first channel region among the plurality of channel regions and a first gate electrode. The display device includes a first connector electrically connecting the first gate electrode of the first transistor and a first conductive region among the plurality of conductive regions to each other. The driving voltage line overlaps at least a portion of the first connector along a direction orthogonal to an upper surface of the substrate.

A third transistor may be connected to the first transistor and the first connector. The third transistor may include a third channel region among the plurality of channel regions. The driving voltage line may overlap at least a portion of the third channel region along the direction orthogonal to the upper surface of the substrate.

A storage line may include a first expansion. The first gate electrode may overlap the first expansion along the direction orthogonal to the upper surface of the substrate to form a first sub-capacitor. The driving voltage line may overlap the first connector along the direction orthogonal to the upper surface of the substrate to form a second sub-capacitor. The first sub-capacitor may overlap a portion of the second sub-capacitor along the direction orthogonal to the upper surface of the substrate.

A planar region of the second sub-capacitor may extend in a second direction crossing the first direction.

The first gate electrode, the first expansion, the first connector, and the driving voltage line may be sequentially arranged above the substrate. The first gate electrode and the first connector may transmit substantially a same voltage. The driving voltage line and the first expansion may transmit substantially a same voltage.

The first expansion may have an opening, and the first connector may be electrically connected to the first gate electrode in the opening.

At least one insulating layer may be positioned between the active pattern and the first connector. A second connector and a third connector may be positioned above the at least one insulating layer. The plurality of conductive regions of the active pattern may include a second conductive region and a third conductive region that are spaced apart from each other. The at least one insulating layer may have a first contact hole positioned above the second conductive region and a second contact hole positioned above the third conductive region. The second connector may be electrically connected to the second conductive region through the first contact hole. The third connector may be electrically connected to the third conductive region through the second contact hole. A width of the third conductive region in one direction may be larger than a width of the second conductive region in the one direction.

A conductor may be positioned on the third connector and may overlap the third connector along the direction orthogonal to the upper surface of the substrate. The conductor may transmit a different voltage from a voltage of the third connector.

A fifth transistor may be connected to the first transistor and may include a fifth channel region. The third conductive region may be connected to the fifth channel region. The third connector may be electrically connected to the driving voltage line. The conductor may include the data line.

The at least one insulating layer may include a third contact hole positioned above the first conductive region. The first connector may be electrically connected to the first conductive region through the third contact hole. A width of the first conductive region in the one direction may be larger than the width of the second conductive region in the one direction.

A first insulating layer may be positioned between a first conductive layer including the plurality of scan lines and the first gate electrode, and the active pattern. A second insulating layer may be positioned on the first conductive layer. A second conductive layer may be positioned on the second insulating layer and may include a storage line. A third insulating layer may be positioned on a third conductive layer and may include the first connector and the second conductive layer. A fourth insulating layer may be positioned above the third conductive layer. A fourth conductive layer positioned above the fourth insulating layer and may include the data line and the driving voltage line.

The third conductive layer may include an initialization voltage line. The initialization voltage line may be electrically connected to a portion of the plurality of conductive regions through a contact hole of the first insulating layer, the second insulating layer, and the third insulating layer.

The fourth conductive layer may be electrically connected to the third conductive layer though a contact hole of the fourth insulating layer.

A display device according to an exemplary embodiment includes a light-emitting element. A sixth transistor is connected to the light-emitting element. A first transistor is connected to the sixth transistor. A capacitor is connected to a first gate electrode of the first transistor. A third transistor is connected to the first transistor. A first connector electrically connects the third transistor and the first gate electrode to each other. A first scan line extends substantially in a first direction. A data line and a driving voltage line cross the first scan line. The driving voltage line overlaps a third channel region of the third transistor along a direction orthogonal to the first direction. The third transistor overlaps the first scan line along the direction orthogonal to the first direction. The driving voltage line overlaps a first channel region of the first transistor.

The driving voltage line may overlap at least a portion of the first connector along the direction orthogonal to the first direction.

A storage line may include a first expansion. The first gate electrode may overlap the first expansion along the direction orthogonal to the first direction to form a first sub-capacitor. The driving voltage line may overlap the first connector along the direction orthogonal to the first direction to form a second sub-capacitor.

The first gate electrode, the first expansion, the first connector, and the driving voltage line may be sequentially arranged above the substrate. The first gate electrode and the first connector may transmit substantially a same voltage. The driving voltage line and the first expansion may transmit substantially a same voltage.

A display device according to an exemplary embodiment includes a substrate and an active pattern positioned above the substrate and including a plurality of channel regions and a plurality of conductive regions. At least one insulating layer is positioned on the active pattern. A first connector and a second connector are positioned on the at least one insulating layer. The plurality of conductive regions of the active pattern include a first conductive region and a second conductive region that are spaced apart from each other. The at least one insulating layer has a first contact hole positioned above the first conductive region, and a second contact hole positioned above the second conductive region. The first connector is electrically connected to the first conductive region through the first contact hole. The second connector is electrically connected to the second conductive region through the second contact hole. A width of the second conductive region in one direction is larger than a width of the first conductive region in the one direction.

A conductor may be positioned on the second connector and may overlap the second connector along a direction orthogonal to an upper surface of the substrate. The conductor may transmit a different voltage from a voltage of the second connector.

A driving voltage line transmitting a driving voltage, and a data line transmitting a data signal may be positioned above the substrate. The conductor may include the data line. The second connector may transmit the driving voltage.

According to an exemplary embodiment of the present invention, a capacitance of a capacitor connected to a driving gate electrode of a display device may be sufficiently obtained such that the voltage of the driving gate electrode may be stably maintained and a display quality defect such as color deviation between pixels and the crosstalk may be reduced or eliminated. A sufficient process margin in the manufacturing process of the display device may be obtained.

DETAILED DESCRIPTION OF THE EMBODIMENTS

Figure 1:
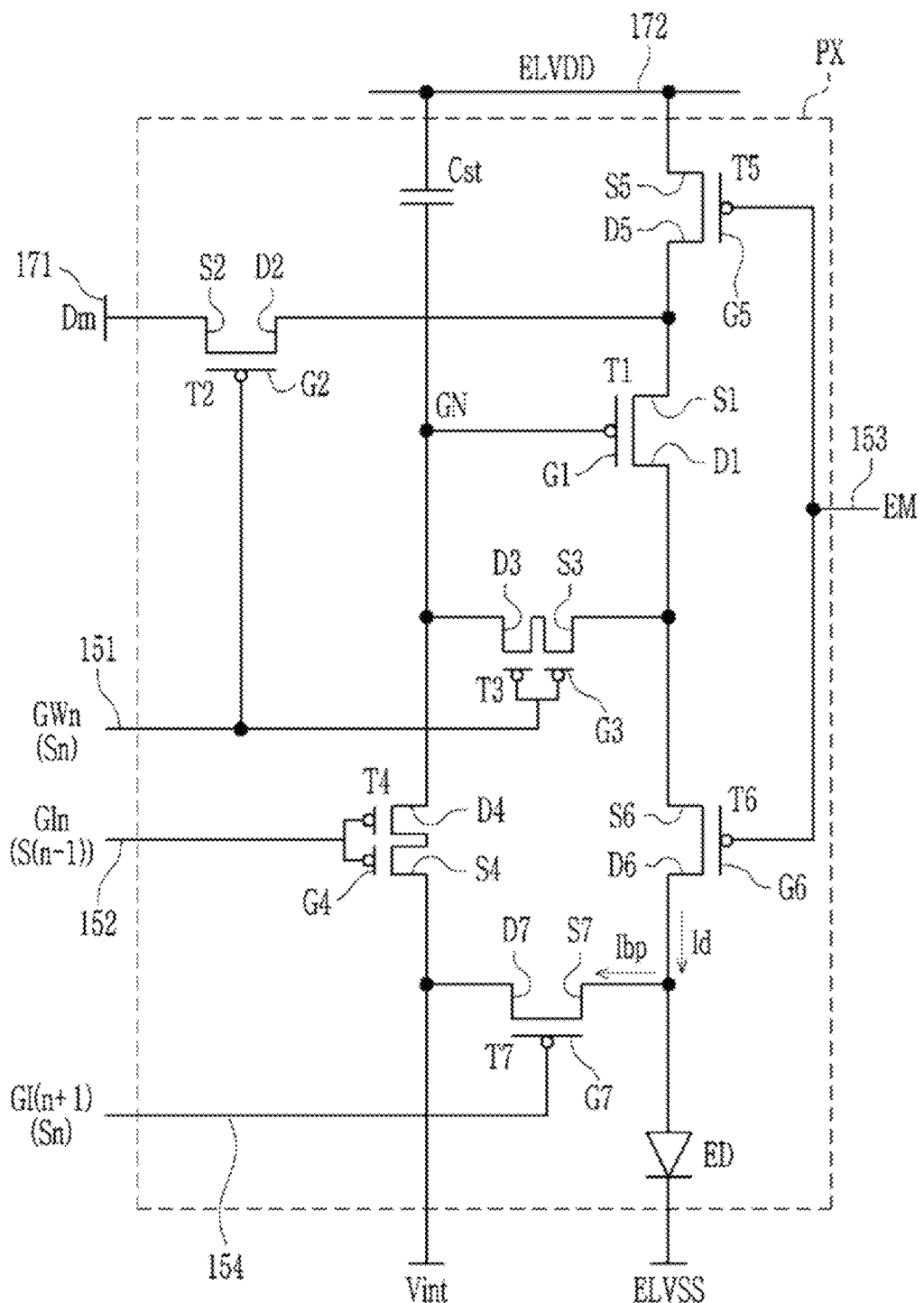
FIG. 1 is a circuit diagram of a pixel of a display device according to an exemplary embodiment of the present invention.

Exemplary embodiments of the present invention will be described in more detail below with reference to the accompanying drawings, in which exemplary embodiments of the present invention are shown. As those skilled in the art would realize, the described embodiments may be modified in various different ways, all without departing from the spirit or scope of the present invention.

In the drawings, the thicknesses of layers, films, panels, or regions may be exaggerated for clarity. Like reference numerals may refer to like elements throughout the specification and drawings. It will be understood that when an element such as a layer, film, region, or substrate is referred to as being "on" another element, it may be directly on the other element or intervening elements may be present.

The phrases "on a plane" or "in a plan view" mean viewing a target portion from the top, and the phrase "on a cross-section" means viewing a cross-section formed by vertically cutting a target portion from the side.

FIG. 1 is a circuit diagram of a pixel of a display device according to an exemplary embodiment of the present invention.

A display device according to an exemplary embodiment of the present invention will be described in more detail below with reference to FIG. 1.

Referring to FIG. 1, a display device according to an exemplary embodiment of the present invention may include a plurality of pixels PX displaying an image, and a plurality of signal lines 151, 152, 153, 154, 171, and 172. One pixel PX may include a plurality of transistors T1, T2, T3, T4, T5, T6, and T7 each respectively connected to at least one of the plurality of signal lines 151, 152, 153, 154, 171, and 172, a capacitor Cst, and at least one light emitting diode (LED) ED. An example in which one pixel PX includes one light emitting diode (LED) ED will be described in more detail below; however, exemplary embodiments of the present invention are not limited thereto.

The signal lines 151, 152, 153, 154, 171, and 172 may include a plurality of scan lines 151, 152, and 154, a plurality of control lines 153, a plurality of data lines 171, and a plurality of driving voltage lines 172.

The plurality of scan lines 151, 152, and 154 may respectively transmit scan signals GWn, GIn, and GI(n+1). The scan signals GWn, GIn, and GI(n+1) may transmit a gate-on voltage and a gate-off voltage turning-on/turning-off the transistors T2, 13, T4, and T7 included in the pixel PX.

The scan lines 151, 152, and 154 connected to one pixel PX may include a first scan line 151 transmitting a scan signal GWn, a second scan line 152 transmitting a scan signal GIn having the gate-on voltage at a different time from that of the first scan line 151, and a third scan line 154 transmitting a scan signal GI(n+1). An example in which the second scan line 152 transmits the gate-on voltage at the earlier time than that of the first scan line 151 will be described in more detail below; however, exemplary embodiments of the present invention are not limited thereto. For example, when the scan signal GWn is an n-th scan signal Sn among scan signals applied during one frame (n is a natural number of 1 or more), the scan signal GIn may be a previous scan signal such as an (n−1)-th scan signal S(n−1), and the scan signal GI(n+1) may be an n-th scan signal Sn. However, exemplary embodiments of the present invention are not limited thereto, and the scan signal GI(n+1) may be a different scan signal from the n-th scan signal Sn.

The control line 153 may transmit a control signal, and for example, may transmit an emission control signal controlling the emission of the light emitting diode (LED) ED included in the pixel PX. The control signal transmitted by the control line 153 may transmit the gate-on voltage and the gate-off voltage, and may have a different waveform from that of the scan signal transmitted by the scan lines 151, 152, and 154.

The data line 171 may transmit the data signal Dm, and the driving voltage line 172 may transmit the driving voltage ELVDD. The data signal Dm may have other voltage levels according to the image signal input to the display device, and the driving voltage ELVDD may have a substantially constant level.

The display device may further include a driver transmitting a signal to the plurality of signal lines 151, 152, 154, 153, 171, and 172.

The plurality of transistors T1, T2, T3, T4, T5, T6, and T7 included in one pixel PX may include a first transistor T1, a second transistor T2, a third transistor T3, a fourth transistor T4, a fifth transistor T5, a sixth transistor T6, and a seventh transistor T7.

The first scan line 151 may transmit the scan signal GWn to the second transistor T2 and the third transistor T3, the second scan line 152 may transmit the scan signal GIn to the fourth transistor T4, the third scan line 154 may transmit the scan signal GI(n+1) to the seventh transistor T7, and the control line 153 may transmit the control signal EM to the fifth transistor T5 and the sixth transistor T6.

A gate electrode G1 of the first transistor T1 may be connected to one terminal Cst1 of the capacitor Cst through a driving gate node GN. A source electrode S1 of the first transistor T1 may be connected to the driving voltage line 172 via the fifth transistor T5. A drain electrode D1 of the first transistor T1 may be connected to an anode of the light emitting diode (LED) ED via the sixth transistor T6. The first transistor T1 may receive a data signal Dm transmitted by the data line 171 depending on a switching operation of the second transistor T2 to supply a driving current Id to the light emitting diode (LED) ED.

A gate electrode G2 of the second transistor T2 may be connected to the first scan line 151. A source electrode S2 of the second transistor T2 may be connected to the data line 171. A drain electrode D2 of the second transistor T2 may be connected to the driving voltage line 172 via the fifth transistor T5 while being connected to the source electrode S1 of the first transistor T1. The second transistor T2 may be turned on depending on the scan signal GWn transmitted through the first scan line 151 such that the data signal Dm transmitted from the data line 171 may be transmitted to the source electrode S1 of the first transistor T1.

A gate electrode G3 of the third transistor T3 may be connected to the first scan line 151. A source electrode S3 of the third transistor T3 may be connected to the anode of the light emitting diode (LED) ED via the sixth transistor T6 while being connected to the drain electrode D1 of the first transistor T1. A drain electrode D3 of the third transistor T3 may be connected to a drain electrode D4 of the fourth transistor T4, one terminal Cst1 of the capacitor Cst, and the gate electrode G1 of the first transistor T1. The third transistor T3 may be turned on depending on the scan signal GWn transmitted through the first scan line 151 to diode-connect the first transistor T1 by connecting the gate electrode G1 and the drain electrode D1 of the first transistor T1 to each other.

A gate electrode G4 of the fourth transistor T4 may be connected to the second scan line 152. A source electrode S4 of the fourth transistor T4 may be connected to an initialization voltage Vint. A drain electrode D4 of the fourth transistor T4 may be connected to one terminal Cst1 of the capacitor Cst and the gate electrode G1 of the first transistor T1 through the drain electrode D3 of the third transistor T3. The fourth transistor T4 may be turned on depending on the scan signal GIn transmitted through the second scan line 152 to transmit the initialization voltage Vint to the gate electrode G1 of the first transistor T1, thus performing an initialization operation of initializing the voltage of the gate electrode G1 of the first transistor T1.

A gate electrode G5 of the fifth transistor T5 may be connected to the control line 153. A source electrode S5 of the fifth transistor T5 may be connected to the driving voltage line 172. A drain electrode D5 of the fifth transistor T5 may be connected to the source electrode S1 of the first transistor T1 and the drain electrode D2 of the second transistor T2.

A gate electrode G6 of the sixth transistor T6 may be connected to the control line 153. A source electrode S6 of the sixth transistor T6 may be connected to the drain electrode D1 of the first transistor T1 and the source electrode S3 of the third transistor T3. A drain electrode D6 of the sixth transistor T6 may be electrically connected to the anode of the light emitting diode (LED) ED. The fifth transistor T5 and the sixth transistor T6 may be substantially simultaneously turned on depending on the emission control signal EM transmitted through the control line 153. Thus, the driving voltage ELVDD may be compensated through the diode-connected first transistor T1 to be transmitted to the light emitting diode (LED) ED.

A gate electrode G7 of the seventh transistor T7 may be connected to the third scan line 154. A source electrode S7 of the seventh transistor T7 may be connected to the drain electrode D6 of the sixth transistor T6 and the anode of the light emitting diode (LED) ED. A drain electrode D7 of the seventh transistor T7 may be connected to the terminal of the initialization voltage Vint and the source electrode S4 of the fourth transistor T4.

The transistors T1, T2, T3, T4, T5, T6, and T7 may be P-type channel transistors such as a PMOS; however, exemplary embodiments of the present invention are not limited thereto, and at least one among the transistors T1, T2, T3, T4, T5, T6, or T7 may be an N-type channel transistor.

One terminal Cst1 of the capacitor Cst may be connected to the gate electrode G1 of the first transistor T1 as described above, and the other terminal Cst2 thereof may be connected to the driving voltage line 172. A cathode of the light emitting diode (LED) ED may be connected to the terminal of the common voltage ELVSS transmitting the common voltage ELVSS to receive the common voltage ELVSS.

The structure of the pixel PX according to an exemplary embodiment of the present invention is not limited to the structure described with reference to FIG. 1, and a number of transistors and a number of capacitors that are included in one pixel PX and a connection relationship thereof may be variously modified.

An operation of the display device according to an exemplary embodiment of the present invention will be described in more detail below with reference to FIG. 1.

If the scan signal Gin of the gate-on voltage level is supplied through the second scan line 152 during an initialization period (the scan signal Gin may be an (n−1)-th scan signal S(n−1), the fourth transistor T4 is turned on, the initialization voltage Vint is transmitted to the gate electrode G1 of the first transistor T1 through the fourth transistor T4, and the first transistor T1 is initialized by the initialization voltage Vint.

Subsequently, if the scan signal GWn of the gate-on voltage level is supplied through the first scan line 151 during a data programming and compensation period (the scan signal GWn may be an n-th scan signal Sn), the second transistor T2 and the third transistor T3 are turned on. The first transistor T1 is diode-connected by the turned-on third transistor T3 and is biased in a forward direction. Thus, a compensation voltage that is decreased by a threshold voltage Vth of the first transistor T1 from the data signal Dm supplied from the data line 171 may be applied to the gate electrode G1 of the first transistor T1. The driving voltage ELVDD and the compensation voltage may be respectively applied to the terminals of the capacitor Cst, and the capacitor Cst may be charged with a charge corresponding to a voltage difference of both terminals.

The light emitting control signal EM supplied from the control line 153 is changed from the gate-off voltage level to the gate-on voltage level during a light emitting period, and the change time may be after the scan signal GWn is applied to all first scan lines 151 in one frame. Thus, during the light emitting period, the fifth transistor T5 and the sixth transistor T6 are turned on, a driving current Id is generated according to the voltage difference between the gate voltage of the gate electrode G1 of the first transistor T1 and the driving voltage ELVDD, and the driving current Id is supplied to the light emitting diode (LED) ED through the sixth transistor T6, thereby a current led flows to the light emitting diode (LED) ED.

According to an exemplary embodiment of the present invention, during an initialization period, the seventh transistor T7 receives the scan signal GI(n+1) of the gate-on voltage level through the third scan line 154 to be turned on. The scan signal GI(n+1) may be the n-th scan signal Sn. A portion of the driving current Id flows out through the turned-on seventh transistor T7 as a bypass current Ibp.

A structure of the display device according to an exemplary embodiment of the present invention will be described in more detail below with reference to FIG. 2 to FIG. 6 along with FIG. 1. For clarity of description, a plane structure of the display device according to an exemplary embodiment of the present invention will be first described, and then a cross-sectional structure of the display device will be described.

Figure 2:
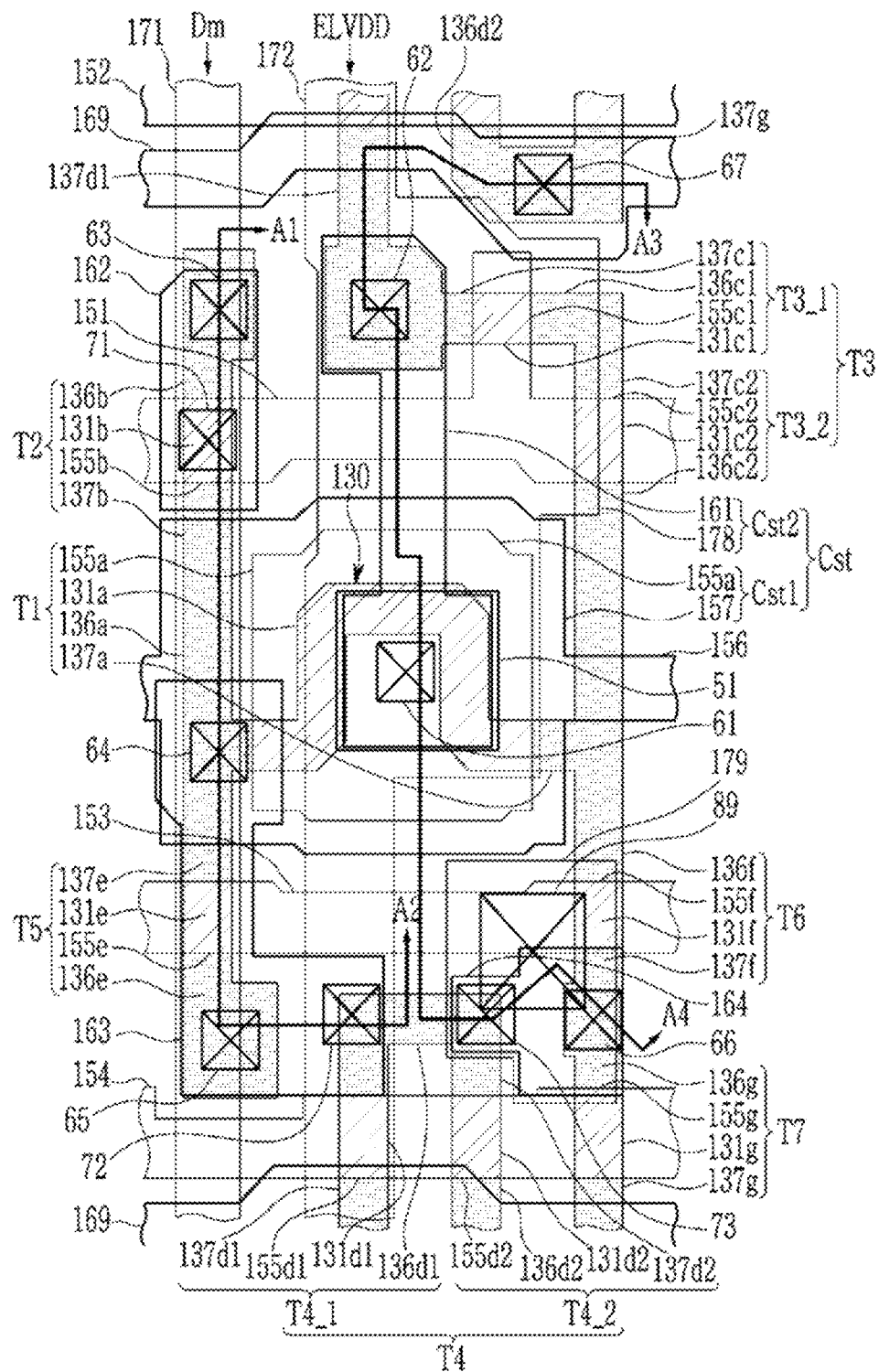
FIG. 2 is a layout view of a pixel of a display device according to an exemplary embodiment of the present invention.
Figure 3:
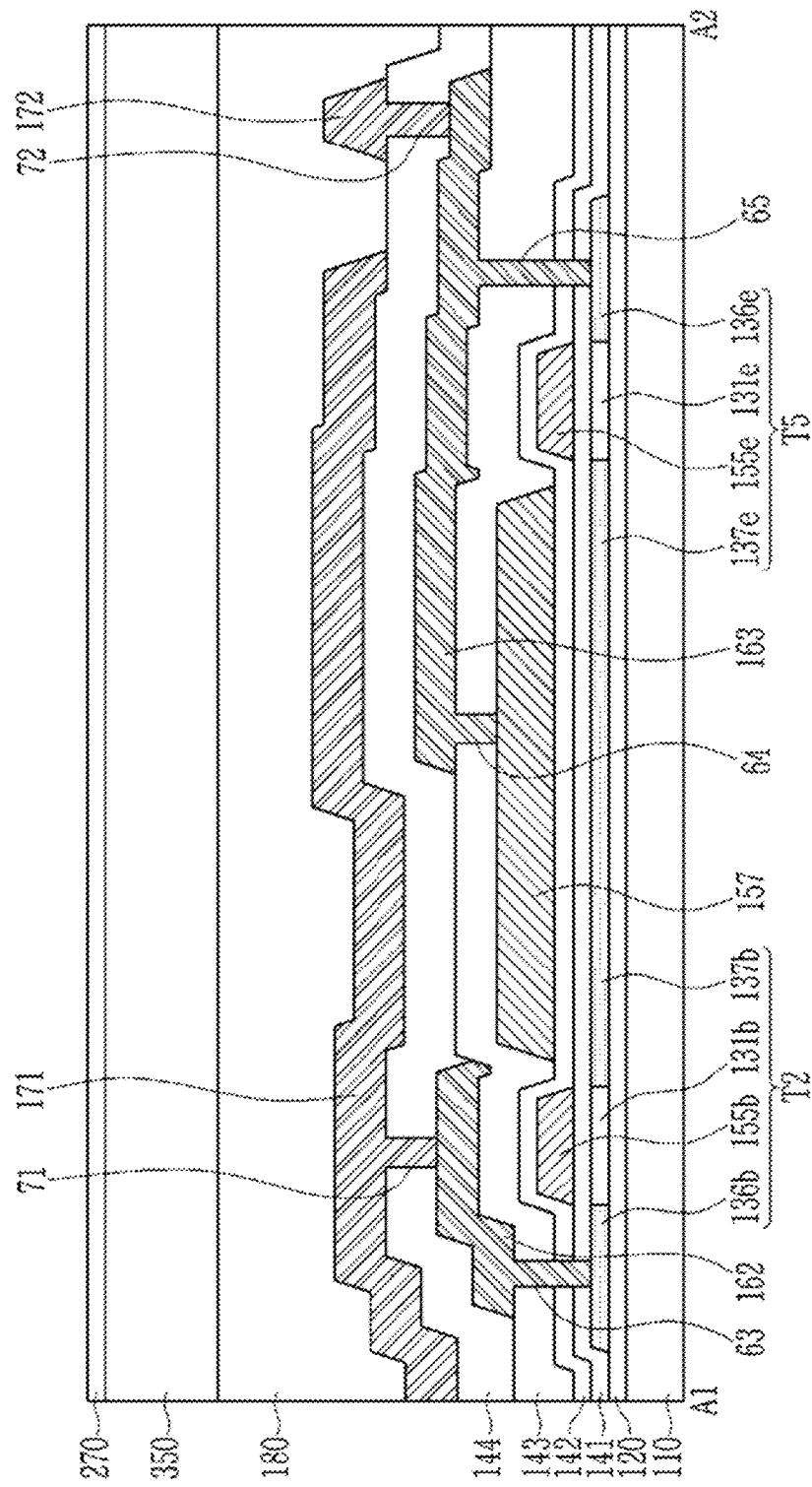
FIG. 3 is a cross-sectional view of a display device shown in FIG. 2 taken along a line A1-A2.
Figure 4:
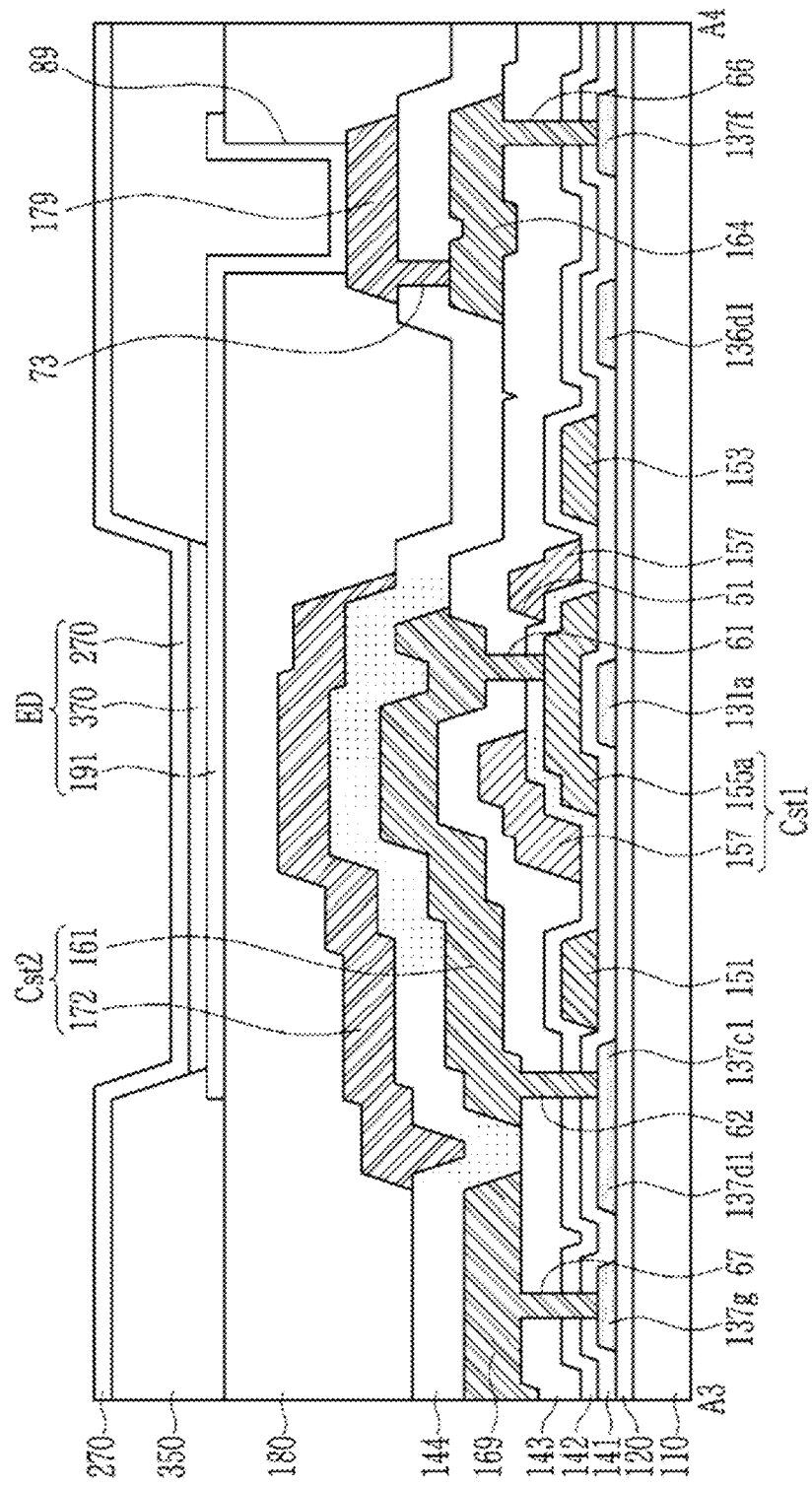
FIG. 4 is a cross-sectional view of a display device shown in FIG. 2 taken along a line A3-A4.
Figure 5:
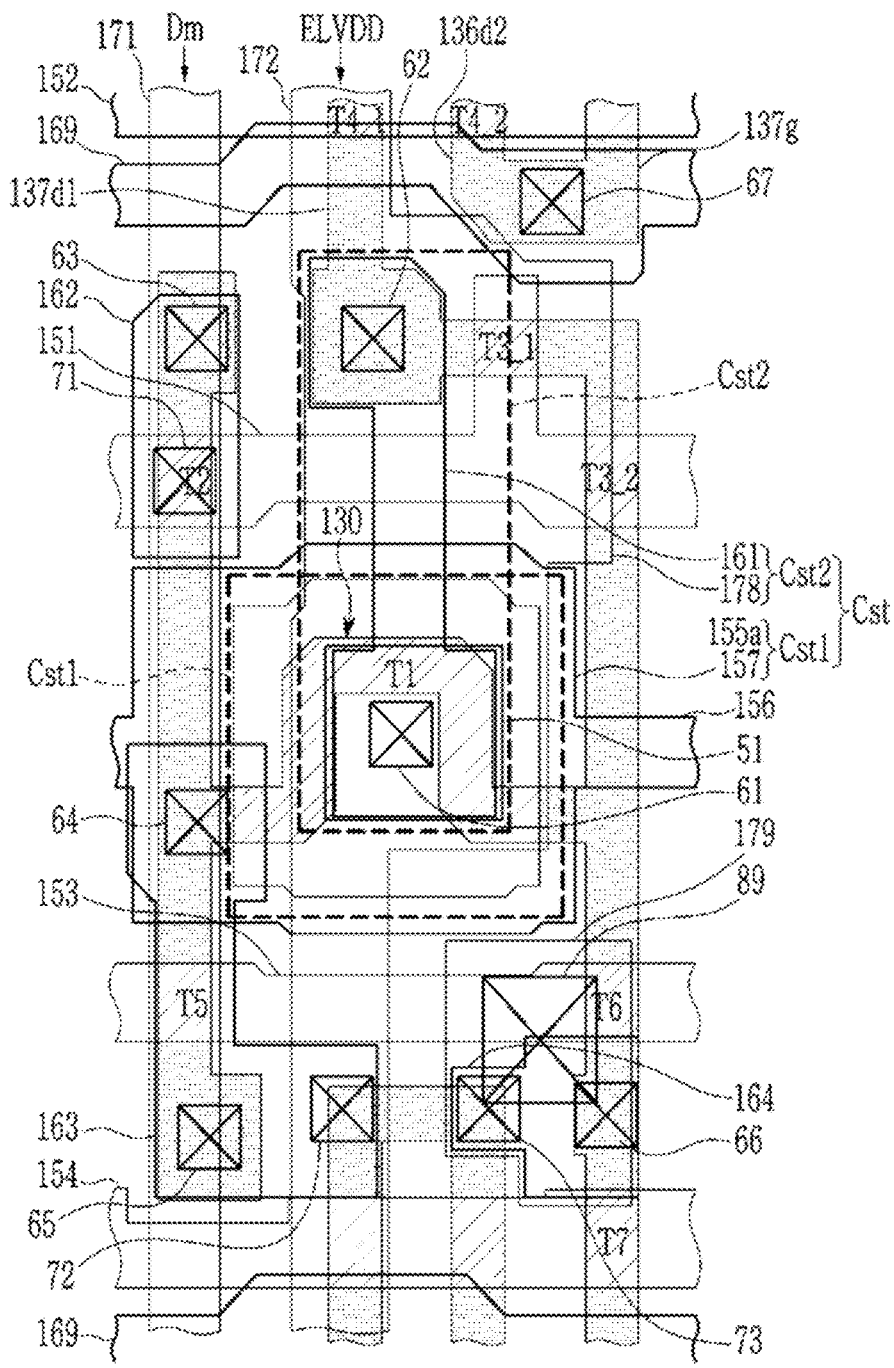
FIG. 5 is a layout view of a pixel of a display device according to an exemplary embodiment of the present invention.
Figure 6:
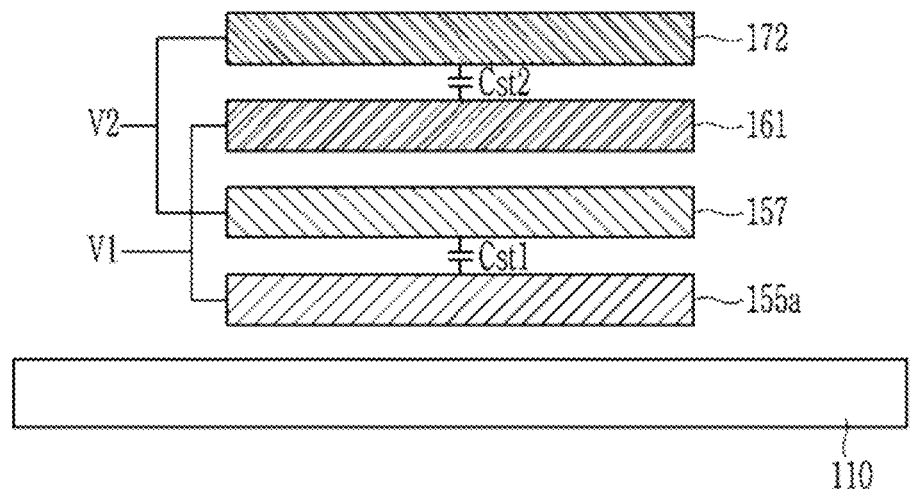
FIG. 6 is a cross-sectional view showing conductors included in a capacitor of a display device according to an exemplary embodiment of the present invention.

FIG. 2 is a layout view of a pixel of a display device according to an exemplary embodiment of the present invention. FIG. 3 is a cross-sectional view of a display device shown in FIG. 2 taken along a line A1-A2. FIG. 4 is a cross-sectional view of a display device shown in FIG. 2 taken along a line A3-A4. FIG. 5 is a layout view of a pixel of a display device according to an exemplary embodiment of the present invention. FIG. 6 is a cross-sectional view showing conductors included in a capacitor of a display device according to an exemplary embodiment of the present invention.

Referring to FIG. 2, one pixel of the display device according to an exemplary embodiment of the present invention may include the plurality of transistors T1, T2, T3, T4, T5, T6, and T7 and the capacitor Cst that are connected to the plurality of scan lines 151, 152, and 154, the control line 153, the data line 171, and the driving voltage line 172. The structure described with reference to FIG. 2 may be repeated in a horizontal direction and a vertical direction.

The plurality of scan lines 151, 152, and 154 and the control line 153 may extend in approximately a same direction (e.g., the horizontal direction) on a same plane. The first scan line 151 may be positioned between the second scan line 152 and the control line 153. The third scan line 154 may have substantially a same configuration as the second scan line 152 and may transmit the scan signal GI(n+1) of the next stage of the scan signal Gin transmitted by the second scan line 152.

The data line 171 and the driving voltage line 172 may extend substantially in the vertical direction, thus crossing the plurality of scan lines 151, 152, and 154 and the control line 153. The data line 171 may transmit the data signal Dm, and the driving voltage line 172 may transmit the driving voltage ELVDD. The driving voltage line 172 may include an expansion 178 positioned in each pixel. The expansion 178 may extend in a direction perpendicular to the extending direction of the driving voltage line 172.

The display device according to an exemplary embodiment of the present invention may include a storage line 156 and an initialization voltage line 169.

The storage line 156 and the initialization voltage line 169 may extend substantially in the horizontal direction. The storage line 156 may be positioned between the first scan line 151 and the control line 153, and may include an expansion 157 positioned in each pixel. The storage line 156 may transmit the driving voltage ELVDD. The expansion 157 may have an opening 51 positioned at an approximate center thereof.

The initialization voltage line 169 transmits the initialization voltage Vint, and most of the initialization voltage line 169 may be positioned between the first scan line 151 and the second scan line 152; however, exemplary embodiments of the present invention are not limited thereto. The initialization voltage line 169 may be relatively close to or may overlap the second scan line 152.

The plurality of scan lines 151, 152, and 154 and the control line 153 may be included in a first conductive layer. Thus the plurality of scan lines 151, 152, and 154 and the control line 153 may be positioned on a same layer as each other when viewed in a cross-section and may include a same material as each other. The storage line 156 may include a second conductive layer as a different layer from the first conductive layer. For example, the second conductive layer may be positioned in a layer on the first conductive layer. The initialization voltage line 169 may be included in a third conductive layer as a different layer from that of the first conductive layer and the second conductive layer. For example, the third conductive layer may be positioned in a layer on the second conductive layer. The data line 171 and the driving voltage line 172 may be included in a fourth conductive layer as a different layer from the first to third conductive layers. Thus, the data line 171 and the driving voltage line 172 may be positioned in a same layer as each other when viewed in a cross-section and may include a same material as each other. For example, the fourth conductive layer may be positioned in a layer on the third conductive layer.

When the initialization voltage line 169 is positioned in the third conductive layer different from the first conductive layer in which the plurality of scan lines 151, 152, and 154 and the control line 153 are positioned, a separation distance between the initialization voltage line 169 and the scan lines 151, 152, and 154 on a plane may be minimized, and a plane overlapping between the initialization voltage line 169 and the second scan line 152 may be present (e.g., along a direction orthogonal to an upper surface of the scan lines 151, 152 and 154). Thus, space utilization efficiency and design freedom may be increased, and thus a relatively high-resolution display device can be manufactured at a lower cost.

Because the voltage difference between the voltage transmitted by the initialization voltage line 169 and the voltage transmitted by the scan line 151, 152, and 154 or the control line 153 is relatively large, if the initialization voltage line 169 is separated from the scan lines 151, 152, and 154 or the control line 153 by only one insulating layer, a risk of the insulating layer being damaged may be relatively large. However, according to an exemplary embodiment of the present invention, because second and third insulating layers 142 and 143 are positioned between the third conductive layer in which the initialization voltage line 169 is positioned and the first conductive layer such as the scan lines 151, 152, and 154 or the control line 153, a cross-sectional distance between the initialization voltage line 169 and the second scan line 152 may be increased such that a short generation risk may be reduced or eliminated, and the plane separation distance between the initialization voltage line 169 and the second scan line 152 may be minimized accordingly.

Each channel of the plurality of transistors T1, T2, T3, T4, T5, T6, and T7 may be formed in one active pattern 130, and the active pattern 130 may be curved in various shapes. The active pattern 130 may include a semiconductor material such as amorphous silicon/polysilicon or an oxide semiconductor.

The active pattern 130 may include a plurality of channel regions and a plurality of conductive regions forming a semiconductor. The channel region may include one or more of channel regions 131a, 131b, 131c1, 131c2, 131d1, 131d2, 131e, 131f, and 131g respectively forming each channel of the transistors T1, T2, T3, T4, T5, T6, and T7. In the active pattern 130, the remaining portion except for the channel regions 131a, 131b, 131c1, 131c2, 131d1, 131d2, 131e, 131f, and 131g may be a conductive region (see, e.g., source and drain regions 136b and 137b illustrated, e.g., in FIG. 3). The conductive region has a higher carrier concentration than that of the channel regions 131a, 131b, 131c1, 131c2, 131d1, 131d2, 131e, 131f, and 131g. A pair of conductive regions positioned at respective sides of the channel regions 131a, 131b, 131c1, 131c2, 131d1, 131d2, 131e, 131f, and 131g may be a source region and a drain region of the corresponding transistors T1, T2, T3, T4, T5, T6, and T7.

The first transistor T1 may include the channel region 131a, a source region 136a and a drain region 137a positioned at respective sides of the channel region 131a, and a driving gate electrode 155a overlapping the channel region 131a along a direction orthogonal to an upper surface of a substrate 110.

The channel region 131a may be curved at least one time. For example, the channel region 131a of the first transistor T1 may have a meandering shape or a zigzag shape. FIG. 2 shows an example in which the channel region 131a forms an approximate "U" shape; however, exemplary embodiments of the present invention are not limited thereto.

The driving gate electrode 155a may be included in the first conductive layer, and may be connected to a connector 161 through a contact hole 61. The contact hole 61 is positioned in the opening 51 of the expansion 157 of the storage line 156. The connector 161 may be positioned in the third conductive layer when viewed in a cross-section. The connector 161 may extend substantially in the vertical direction and may cross the first scan line 151. The connector 161 may be in a position corresponding to the driving gate node GN (see, e.g., FIG. 1) along with the driving gate electrode 155a.

The second transistor T2 may include the channel region 131b, a source region 136b and a drain region 137b positioned at respective sides of the channel region 131b, and a gate electrode 155b overlapping the channel region 131b along a direction orthogonal to an upper surface of the substrate 110. The gate electrode 155b may be a part of the first scan line 151. The source region 136b may be connected to a connector 162 through a contact hole 63, and the drain region 137b may be connected to the source region 136a of the first transistor T1.

The connector 162 may be positioned in the third conductive layer when viewed in a cross-section. The connector 162 may be connected to the data line 171 through a contact hole 71 such that the source region 136b is electrically connected to the data line 171, thus receiving the data signal Dm.

The third transistor T3 may include two parts, which may prevent a leakage current. As an example, the third transistor T3 may include a third transistor first part T3_1 and a third transistor second part T3_2 that are adjacent to each other and connected to each other.

The third transistor first part T3_1 may include the channel region 131c1 overlapping the first scan line 151 along a direction orthogonal to an upper surface of the substrate 110, a source region 136c1 and a drain region 137c1 positioned at respective sides of the channel region 131c1, and a gate electrode 155c1 overlapping the channel region 131c1 along the direction orthogonal to the upper surface of the substrate 110. The gate electrode 155c1 may be a protrusion of the first scan line 151. The drain region 137c1 may be connected to the connector 161 through a contact hole 62.

The third transistor first part T3.2 may include the channel region 131c2 overlapping the first scan line 151 along the direction orthogonal to the upper surface of the substrate 110, a source region 136c2 and a drain region 137c2 positioned at respective sides of the channel region 131c2, and a gate electrode 155c2 overlapping the channel region 131c2 along the direction orthogonal to the upper surface of the substrate 110. The gate electrode 155c2 may be a part of the first scan line 151. The source region 136c2 of the third transistor second part T3_2 may be connected to the drain region 137a of the first transistor T1, and the drain region 137c2 may be connected to the source region 136c1 of the third transistor first part T3_1.

The fourth transistor T4 may include two parts, which may prevent a leakage current. As an example, the fourth transistor T4 may include a fourth transistor first part T4_1 and a fourth transistor second part T4_2 that are adjacent to each other and connected to each other. The fourth transistor first part T4_1 and the fourth transistor second part T4_2 may be positioned at a position crossing the second scan line 152, or may be positioned at a position crossing the third scan line 154 (see, e.g., FIG. 2).

The fourth transistor first part T4_1 may include the channel region 131d1 overlapping the second scan line 152 (or the third scan line 154) along the direction orthogonal to the upper surface of the substrate 110, a source region 136d1 and a drain region 137d1 positioned at respective sides of the channel region 131d1, and a gate electrode 155d1 overlapping the channel region 131d1. The gate electrode 155d1 may be a part of the second scan line 152 (or the third scan line 154). The drain region 137d1 may be connected to the drain region 137c1 of the third transistor first part T3_1, and may be connected to the connector 161 through the contact hole 62.

The fourth transistor first part T4_2 may include the channel region 131d2 overlapping the second scan line 152 (or the third scan line 154) along the direction orthogonal to the upper surface of the substrate 110, a source region 136d2 and a drain region 137d2 positioned at respective sides of the channel region 131d2, and a gate electrode 155d2 overlapping the channel region 131d2. The gate electrode 155d2 may be a part of the second scan line 152 (or the third scan line 154). The drain region 137d2 may be connected to the source region 136d1 of the fourth transistor first part T4_1, and the source region 136d2 may be connected to the initialization voltage line 169 through a contact hole 67.

The fifth transistor T5 may include the channel region 131e, a source region 136e and a drain region 137e positioned at respective sides of the channel region 131e, and a gate electrode 155e overlapping the channel region 131e along the direction orthogonal to the upper surface of the substrate 110. The gate electrode 155e may be a part of the control line 153. The source region 136e may be connected to a connector 163 through a contact hole 65, and the drain region 137e may be connected to the source region 136a of the first transistor T1.

The connector 163 may be positioned in the third conductive layer when viewed a cross-section. The connector 163 may extend in the horizontal direction to be connected to the driving voltage line 172 through a contact hole 72 such that the source region 136e is electrically connected to the driving voltage line 172, thus receiving the driving voltage ELVDD. The connector 163 may also extend in the vertical direction to be connected to the expansion 157 of the storage line 156 through a contact hole 64, thus transmitting the driving voltage ELVDD to the storage line 156.

The sixth transistor T6 may include the channel region 131f, a source region 136f and a drain region 137f positioned at respective sides of the channel region 131f, and a gate electrode 155f overlapping the channel region 131f along the direction orthogonal to the upper surface of the substrate 110. The gate electrode 155f may be a part of the control line 153. The source region 136f may be connected to the drain region 137a of the first transistor T1, and the drain region 137f is connected to a connector 164 through a contact hole 66.

The connector 164 may be positioned in the third conductive layer when viewed in a cross-section. The connector 164 may be connected to a connector 179 positioned in the fourth conductive layer through a contact hole 73.

The seventh transistor T7 may include the channel region 131g, a source region 136g and a drain region 137g positioned at respective sides of the channel region 131g, and a gate electrode 155g overlapping the channel region 131g along the direction orthogonal to the upper surface of the substrate 110. The gate electrode 155g may be a part of the third scan line 154. The source region 136g may be connected to the drain region 137f of the sixth transistor T6, and the drain region 137g may be connected to the initialization voltage line 169 through the contact hole 67 (see, e.g., FIG. 2), thus receiving the initialization voltage Vint.

The capacitor Cst may maintain the voltage of the driving gate electrode 155a. The capacitor Cst may include first and second sub-capacitors Cst1 and Cst2.

The first sub-capacitor Cst1 may include the driving gate electrode 155a and the expansion 157 of the storage line 156, overlapping each other along the direction orthogonal to the upper surface of the substrate 110, as two terminals. The expansion 157 of the storage line 156 may have a wider area than the driving gate electrode 155a on a plane, and may entirely cover the entire area of the driving gate electrode 155a (see, e.g., FIG. 3). For example, referring to FIG. 3, the driving gate electrode 155a may be positioned below and may be completely covered by the expansion 157 of the storage line 156 along the direction orthogonal to the upper surface of the substrate 110.

The second sub-capacitor Cst2 may include the connector 161 and the driving voltage line 172 (e.g., including the expansion 178) overlapping each other along the direction orthogonal to the upper surface of the substrate 110 as two terminals. The driving voltage line 172 (e.g., including the expansion 178) may cover most of the connector 161 to be overlapped along the direction orthogonal to the upper surface of the substrate 110. The driving voltage line 172 may overlap the expansion 178 in the horizontal direction to overlap most of the connector 161.

According to an exemplary embodiment of the present invention, the driving gate electrode 155a as one terminal of the first sub-capacitor Cst1 is electrically connected to the connector 161 as one terminal of the second sub-capacitor Cst2, thus receiving the same voltage, and the expansion 157 of the storage line 156 as the other terminal of the first sub-capacitor Cst1 transmits the driving voltage ELVDD like the driving voltage line 172 as the other terminal of the second sub-capacitor Cst2, and resultantly, the first and second sub-capacitors Cst1 and Cst2 have an in-parallel connection relationship in the circuit diagram. Thus, since the capacitance of the capacitor Cst may be substantially increased even in a narrow space on a plane, the capacitance of the capacitor Cst may be increased, and accordingly, display quality defect such as color deviation between the pixels and the crosstalk may be reduced or eliminated. For example, even in the display device of relatively high resolution, the capacitance of the capacitor Cst may be increased such that the voltage of the driving gate electrode 155a may be stably maintained, thus reducing or eliminating display quality defects.

Referring to FIG. 2, on a plane, the driving voltage line 172 (e.g., including the expansion 178) may overlap the channel region 131a of the first transistor T1 and may also overlap at least a portion of the channel regions 131c1 and 131c2 of the third transistor T3 along a direction orthogonal to an upper surface of the substrate 110. For example, the expansion 178 of the driving voltage line 172 may cover the entire area of the channel region 131c1 of the third transistor first part T3_1, and may also cover the partial area of the channel region 131c2 of the third transistor second part T3_2. The expansion 178 may also cover the boundaries between the channel region 131c1 of the third transistor first part T3_1 and the source region 136c1/the drain region 137c1. Thus, external light may be prevented from being incident to the channel region 131c1 of the third transistor first part T3_1 directly connected to the driving gate electrode 155a by the driving voltage line 172 such that the leakage current may be prevented from being generated in the third transistor first part T3_1. Thus, the voltage change of the driving gate electrode 155a due to the external light may be prevented such that the display defect such as the luminance change of the image and the color coordinate change may be prevented.

The driving voltage line 172 may cover most of the area of the channel region 131d1 of the fourth transistor first part T4_1. Thus, the external light may be prevented from being incident to the channel region 131d1 of the fourth transistor first part T4_1 directly connected to the driving gate electrode 155a by the driving voltage line 172 such that the generation of the leakage current may be prevented in the fourth transistor first part T4_1. Thus, the voltage change of the driving gate electrode 155a may be prevented such that the display defect such as the luminance change of the image and the color coordinate change may be prevented.

A cross-sectional structure of the display device according to an exemplary embodiment of the present invention will be described in more detail below with reference to FIG. 3 and FIG. 4, as well as FIG. 2.

The display device according to an exemplary embodiment of the present invention may include the substrate 110. The substrate 110 may include an inorganic insulating material such as glass or an organic insulating material such as a plastic such as polyimide (PI), and may have flexibility of various levels.

A buffer layer 120 may be disposed on the substrate 110. The buffer layer 120 may block a transfer of impurities from the substrate 110 to an upper layer of the buffer layer 120, and particularly the active pattern 130, to serve to reduce or eliminate an infusion of impurities into the active pattern 130 and reduce stress applied to the active pattern 130. The buffer layer 120 may include an inorganic insulating material such as a silicon nitride (SiNx) or a silicon oxide (SiOx), or an organic insulating material. A portion or the entire buffer layer 120 may be omitted.

The active pattern 130 may be disposed on the buffer layer 120, and a first insulating layer 141 may be disposed on the active pattern 130.

A first conductive layer including the plurality of scan lines 151, 152, and 154, the control line 153, and the driving gate electrode 155a may be disposed on the first insulating layer 141.

The second insulating layer 142 may be positioned above the first conductive layer and the first insulating layer 141, and a second conductive layer including the storage line 156 may be disposed on the second insulating layer 142. The expansion 157 of the storage line 156 may overlap the driving gate electrode 155a via the second insulating layer 142, thus forming a first sub-capacitor Cst1.

The third insulating layer 143 may be disposed on the second conductive layer and the second insulating layer 142.

The third insulating layer 143 may include the contact hole 64 positioned above the expansion 157 of the storage line 156. The second and third insulating layers 142 and 143 may include the contact hole 61 positioned above the driving gate electrode 155a. The first to third insulating layers 141, 142, and 143 may include the contact hole 62 positioned where the drain region 137c1 of the third transistor first part T3_1 and the drain region 137d1 of the fourth transistor first part T4_1 meet each other. The contact hole 63 may be positioned above the source region 136b of the second transistor T2. The contact hole 65 may be positioned above the source region 136e of the fifth transistor T5. The contact hole 66 may be positioned above the drain region 137f of the sixth transistor T6. The contact hole 67 may be positioned where the source region 136d2 of the fourth transistor second part T4_2 and the drain region 137g of the seventh transistor T7 meet each other.

A third conductive layer including the initialization voltage line 169 and the plurality of connectors 161, 162, 163, and 164 may be disposed on the third insulating layer 143.

The initialization voltage line 169 may be electrically connected to the source region 136d2 of the fourth transistor second part T4_2 and the drain region 137g of the seventh transistor T7 through the contact hole 67. The connector 161 may be electrically connected to the driving gate electrode 155a, the drain region 137c1 of the third transistor first part T3_1, and the drain region 137d1 of the fourth transistor first part T4_1 through the contact holes 61 and 62. The connector 162 may be electrically connected to the source region 136b of the second transistor T2 through the contact hole 63. The connector 163 may be electrically connected to the expansion 157 of the storage line 156 and the source region 136e of the fifth transistor T5 through the contact holes 64 and 65. The connector 164 may be electrically connected to the drain region 137f of the sixth transistor T6 through the contact hole 66.

A fourth insulating layer 144 may be disposed on the third conductive layer and the third insulating layer 143.

The fourth insulating layer 144 may include the contact hole 71 positioned above the connector 162, the contact hole 72 positioned above the connector 163, and the contact hole 73 positioned above the connector 164.

At least one among the first insulating layer 141, the second insulating layer 142, the third insulating layer 143, and the fourth insulating layer 144 may include an inorganic insulating material such as a silicon nitride, a silicon oxide, and/or the organic insulating material.

The fourth conductive layer including the data line 171, the driving voltage line 172, and the connector 179 may be disposed on the fourth insulating layer 144. The data line 171 may be electrically connected to the connector 162 through the contact hole 71. The driving voltage line 172 may be electrically connected to the connector 163 through the contact hole 72. The connector 179 may be electrically connected to the connector 164 through the contact hole 73.

The driving voltage line 172 (e.g., including the expansion 178) may overlap the connector 161 along a direction orthogonal to an upper surface of the substrate 110. The fourth insulating layer 144 may be disposed between the driving voltage line 172 and the connector 161. Thus the second sub-capacitor Cst2 may be formed.

At least one among the first conductive layer, the second conductive layer, the third conductive layer, or the fourth conductive layer may include a conductive material such as copper (Cu), aluminum (Al), molybdenum (Mo), titanium (Ti), and tantalum (Ta), or alloys of at least two among them.

A passivation layer 180 may be disposed on the fourth conductive layer and the fourth insulating layer 144. The passivation layer 180 may include an organic insulating material such as a polyacryl-based resin and a polyimide-based resin, and an upper surface of the passivation layer 180 may be substantially flat. The passivation layer 180 may include a contact hole 89 positioned above the connector 179.

A fifth conductive layer including a plurality of pixel electrodes 191 may be disposed on the passivation layer 180. Each pixel electrode 191 may be connected to the connector 179 through the contact hole 89, thus receiving a voltage. The plurality of pixel electrodes 191 may be arranged in a pentile matrix form.

A pixel defining layer (PDL) 350 may be positioned on the passivation layer 180 and the pixel electrode 191. The pixel defining layer 350 may include an opening positioned above each pixel electrode 191.

An emission layer 370 may be disposed on the pixel electrode 191. The emission layer 370 may be positioned in the opening of the pixel defining layer 350. The emission layer 370 may include an organic light emission material or an inorganic light emission material.

A common electrode 270 may be positioned on the emission layer 370. The common electrode 270 may be disposed on the pixel defining layer 350, thus extending throughout the plurality of pixels.

The pixel electrode 191, the emission layer 370, and the common electrode 270 together may form the light emitting diode (LED) ED.

An encapsulation layer protecting the light emitting diode (LED) ED may be further positioned on the common electrode 270. The encapsulation layer may include an inorganic layer and an organic layer that are alternately stacked.

Referring to FIG. 5, the connector 161 may include a portion overlapping the driving gate electrode 155a along a direction orthogonal to an upper surface of the substrate 110 to be connected to the driving gate electrode 155a through the contact hole 61. Thus, the planar region (indicated by a dotted line) of the first sub-capacitor Cst1 and the planar region (indicated by a dotted line) of the second sub-capacitor Cst2 may be overlapped along the direction orthogonal to the upper surface of the substrate 110. As an example, a lower part of the planar region of the second sub-capacitor Cst2 overlaps the planar region of the first sub-capacitor Cst1, and the planar region of the second sub-capacitor Cst2 may have a shape that extends long upwardly from the overlapping region with the planar region of the first sub-capacitor Cst1.

FIG. 6 shows a cross-sectional arrangement of conductors configuring a terminal of the first sub-capacitor Cst1 and the second sub-capacitor Cst2. Referring to FIG. 6, the connector 161 electrically connected to the driving gate electrode 155a receives a same voltage V1 as the driving gate electrode 155a, and the expansion 157 of the storage line 156 electrically connected to the driving voltage line 172 receives a same voltage V2 as the driving voltage line 172. Referring to the cross-sectional structure, the driving gate electrode 155a, the expansion 157 of the storage line 156, the connector 161, and the driving voltage line 172 may be sequentially disposed on the substrate 110. The driving gate electrode 155a and the expansion 157 of the storage line 156 adjacent to each other when viewed in a cross-section via the insulating layer may form the first sub-capacitor Cst1, and the connector 161 and the driving voltage line 172 adjacent to each other when viewed in a cross-section via the insulating layer may form the second sub-capacitor Cst2. Four conductors forming the terminals of the first sub-capacitor Cst1 and the second sub-capacitor Cst2 may be alternatingly arranged on a plane. Thus, the first and second sub-capacitors Cst1 and Cst2 may be effectively formed in a relatively limited space.

The connector 161 may overlap the expansion 157 of the storage line 156 adjacent via the insulating layer along the direction orthogonal to the upper surface of the substrate 110, thus further forming an additional sub-capacitor. When also considering the additional sub-capacitor, the capacitor Cst according to an exemplary embodiment of the present invention may include at least three sub-capacitors that are coupled in parallel to each other.

According to an exemplary embodiment of the present invention, the at least two sub-capacitors Cst1 and Cst2 that are coupled in parallel may be formed by using four conductors positioned at different conductive layers from each other in a relatively limited plane space, thus increasing the capacitance of the capacitor Cst by two times or more. Referring to FIG. 5, since at least two sub-capacitors Cst1 and Cst2 are at least partially overlapped along the direction orthogonal to the upper surface of the substrate 110, the space utilization efficiency may increase. Thus, even if the display device has relatively high resolution, a capacitor Cst of sufficient capacitance may be obtained such that the display quality defects such as color deviation and crosstalk may be reduced or eliminated.

According to an exemplary embodiment of the present invention, only one of the first and second sub-capacitors Cst1 and Cst2 might be selected as desired, and thus a freedom of design may be increased.

The active pattern 130 of the display device according to an exemplary embodiment of the present invention will be described in more detail below with reference to FIG. 7 to FIG. 9 as well as the above-described drawings.

Figure 7:
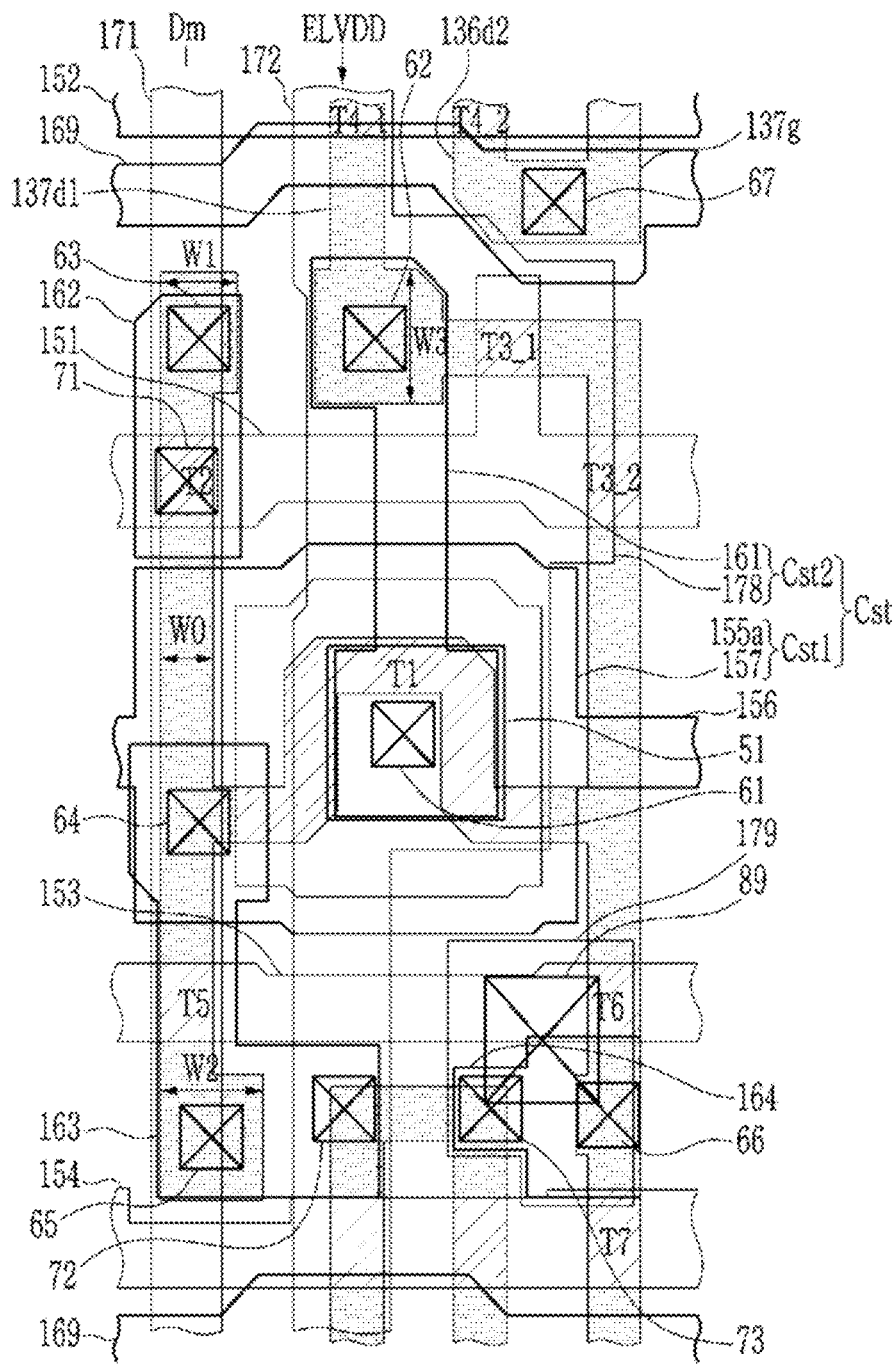
FIG. 7 is a layout view of a pixel of a display device according to an exemplary embodiment of the present invention.

FIG. 7 is a layout view of a pixel of a display device according to an exemplary embodiment of the present invention. FIG. 8 is a cross-sectional view of a display device according to a comparative example. FIG. 9 is an image showing a defect appearing in a display device according to a comparative example shown in FIG. 8.

Referring to FIG. 7, a width W0 of a continuous portion of the active pattern 130 may be substantially constant, and the active pattern 130 may have an expanded width on a plane at the position overlapping the contact holes 62, 63, 65, 66, and 67 to be electrically connected to the constituent elements of the different layers. For example, a width W1 (e.g., a horizontal direction width) of the end of the source region 136b of the second transistor T2 overlapping the contact hole 63 among the active pattern 130 along the direction orthogonal to the upper surface of the substrate 110 may be larger than the surrounding active pattern 130. Similarly, a width W2 (e.g., a horizontal direction width) of the end of the source region 136e of the fifth transistor T5 overlapping the contact hole 65 among the active pattern 130 may be larger than the surrounding active pattern 130. However, since the width W2 is larger than the width W1, a margin of the space where the contact hole 65 may overlap the active pattern 130 along the direction orthogonal to the upper surface of the substrate 110 may be increased. The width W2 is discussed in more detail below.

Figure 8:
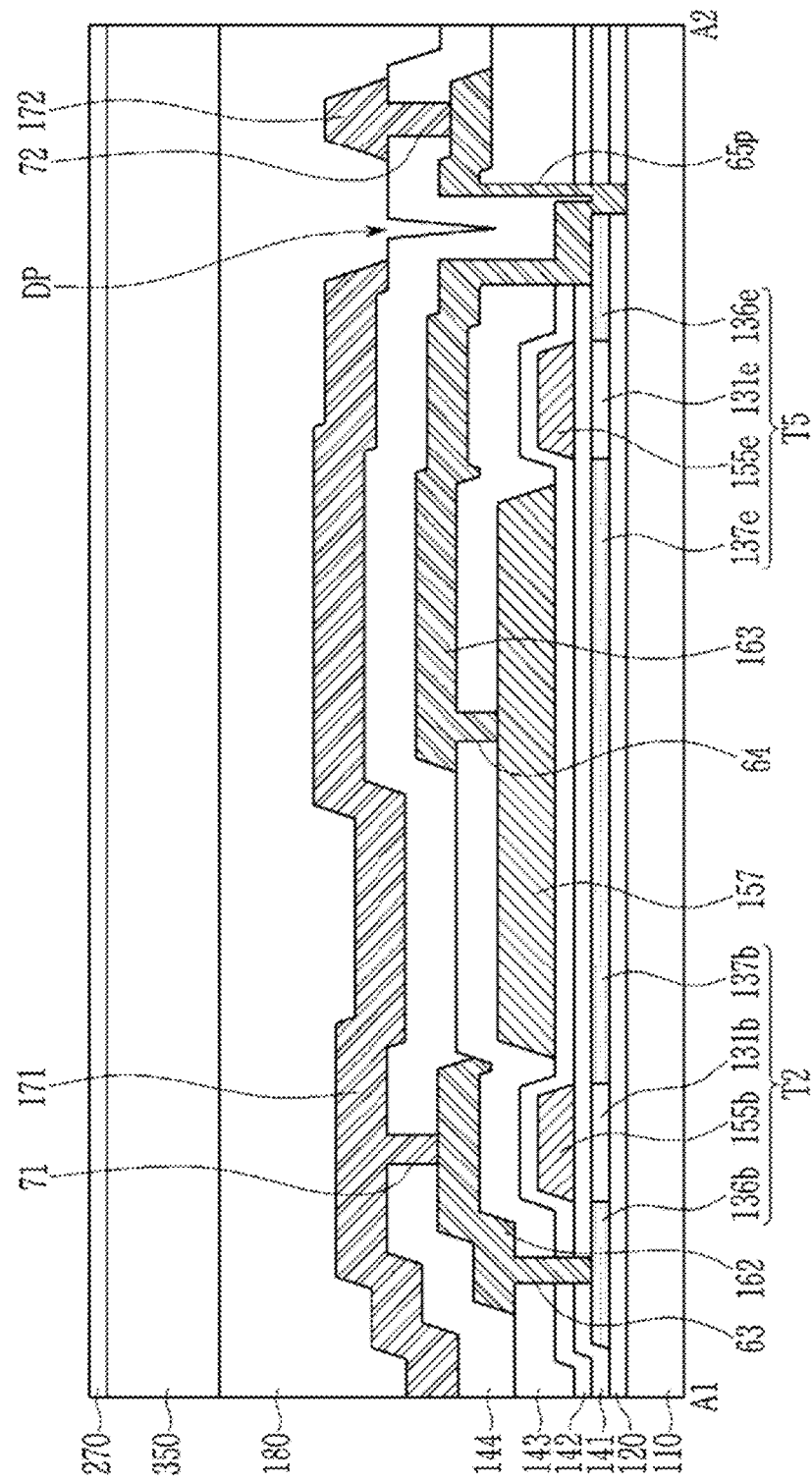
FIG. 8 is a cross-sectional view of a display device according to a comparative example.

FIG. 8 illustrates a similar cross-sectional view as that illustrated in FIG. 3 as described above. FIG. 8 shows that the width of the source region 136e of the fifth transistor T5 is reduced compared with the width of the source region 136e illustrated in FIG. 3. FIG. 9 is an image showing the cross-section of the source region 136e portion of the fifth transistor T5 according to the comparative example described with reference to FIG. 8.

Figure 9:
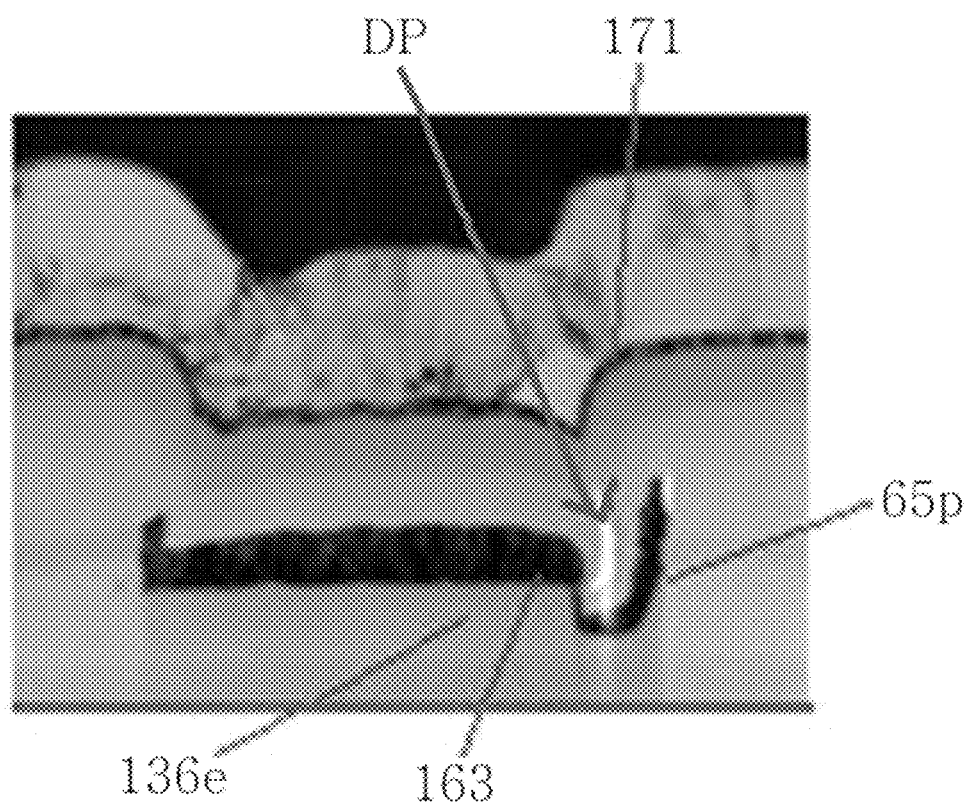
FIG. 9 is an image showing a defect appearing in a display device according to a comparative example shown in FIG. 8, FIG. 10, FIG. 13, FIG. 16, FIG. 19, FIG. 22, FIG. 25, and FIG. 28 are each layout views of a pixel of a display device in intermediate process steps of a manufacturing method of a display device according to an exemplary embodiment of the present invention.

Referring to FIG. 8, if the width of the source region 136e of the fifth transistor T5 is reduced, when a process error such as a misalignment in a manufacturing process is generated, the contact hole 65 might not overlap the active pattern 130 along the direction orthogonal to the upper surface of the substrate 110 such that a contact hole 65p may be formed (see, e.g., FIG. 8 and FIG. 9). Although the contact hole 65p is beyond the edge of the active pattern 130 such that the contact hole 65p is also formed in the buffer layer 120, the cross-section of the contact hole 65p may have a step shape. Thus, the layers positioned thereon have the step shape depending on the profile of the contact hole 65p, such that the fourth insulating layer 144 has a portion DP that is downwardly recessed, and the fourth conductive layer (e.g., the data line 171) positioned on the fourth insulating layer 144 has a relatively high risk of being electrically short-circuited with the third conductive layer (e.g., the connector 163) in the recessed portion DP of the fourth insulating layer 144.

Similarly, a short circuit may be generated on other portions, for example, the surroundings of the active pattern 130 overlapping the contact hole 63. Two conductors that are connected, such as the data line 171 and the connector 162, may transmit substantially the same voltage such that the risk of the defect due to the short is low. However, the short generated when the width W2 of the end of the source region 136e of the fifth transistor T5 is not sufficient becomes the short between the data line 171 and the connector 163 that transmit the different voltages from each other.

According to an exemplary embodiment of the present invention, in the part where the risk of the third conductive layer and the fourth conductive layer transmitting different voltages from each other being shorted is relatively high (see, e.g., FIG. 7), the occurrence of a short may be reduced or eliminated by extending the width W2 of the active pattern 130 overlapping the contact hole 65 more than the other portion.

Similarly, according to an exemplary embodiment of the present invention, the connector 161 and the driving voltage line 172 are overlapped on the active pattern 130 overlapping the contact hole 62. The connector 161 and the driving voltage line 172 transmit different voltages such that the short does not occur. Thus, to obtain the process margin such that the contact hole 62 does not deviate from its intended position on the active pattern 130 when forming the contact hole 62, the width W3 (shown in the vertical direction as an example, however it may be the width in the horizontal direction) of the active pattern 130 overlapping the contact hole 62 (e.g., the part where the drain region 137c1 of the third transistor first part T3_1 and the drain region 137d1 of the fourth transistor first part T4_1 meet each other) is set greater than the regular width W1, so the risk of a short generation may be reduced or eliminated.

A manufacturing method of the display device according to an exemplary embodiment of the present invention will be described in more detail below with reference to FIG. 10 to FIG. 30 as well as FIG. 1 to FIG. 4 described above.

FIG. 10, FIG. 13, FIG. 16, FIG. 19, FIG. 22, FIG. 25, and FIG. 28 are each layout views of a pixel of a display device in intermediate process steps of a manufacturing method of a display device according to an exemplary embodiment of the present invention. FIG. 11, FIG. 14, FIG. 17, FIG. 20, FIG. 23, FIG. 26, and FIG. 29 are cross-sectional views of a display device in intermediate process steps shown in FIG. 10, FIG. 13, FIG. 16, FIG. 19, FIG. 22, FIG. 25, and FIG. 28 taken along a line A1-A2, respectively. FIG. 12, FIG. 15, FIG. 18, FIG. 21, FIG. 24, FIG. 27, and FIG. 30 are cross-sectional views of a display device in intermediate process steps shown in FIG. 10, FIG. 13, FIG. 16, FIG. 19, FIG. 22, FIG. 25, and FIG. 28 taken along a line A3-A4, respectively.

Figure 10:
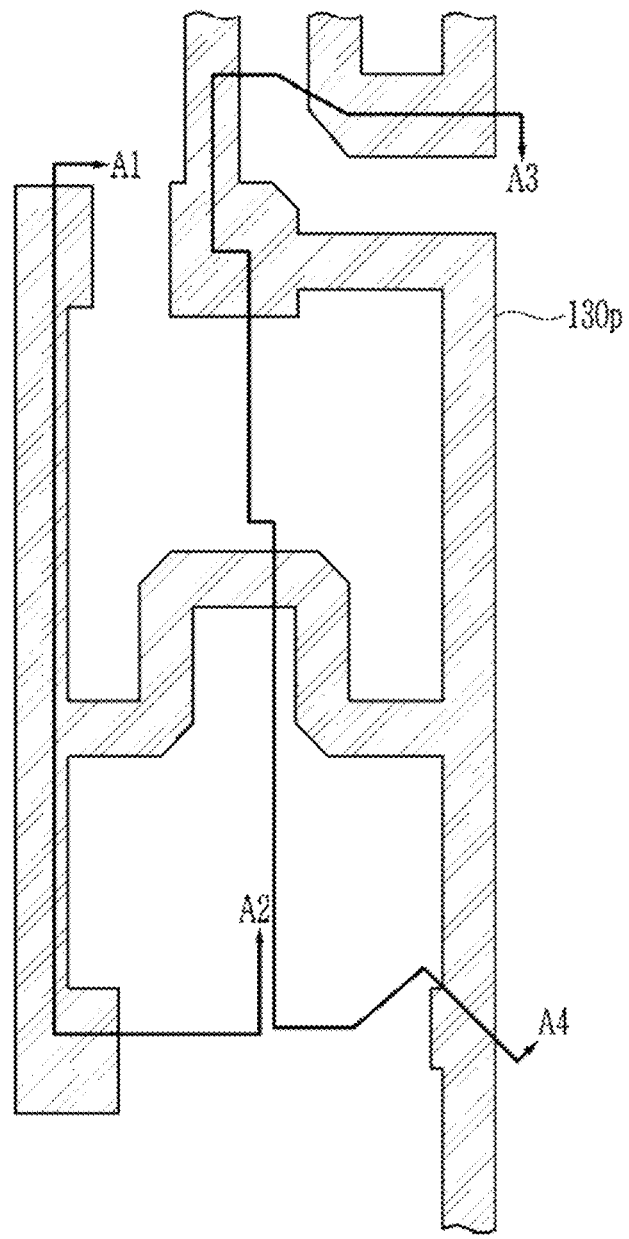
Figure 11:
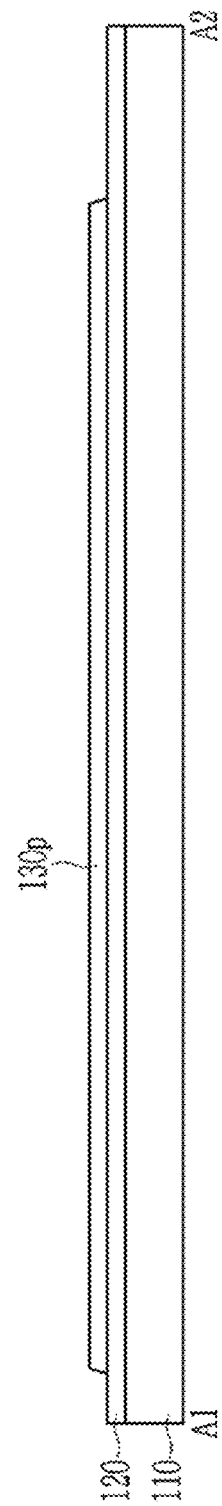
FIG. 11, FIG. 14, FIG. 17, FIG. 20, FIG. 23, FIG. 26, and FIG. 29 are cross-sectional views of a display device in intermediate process steps shown in FIG. 10, FIG. 13, FIG. 16, FIG. 19, FIG. 22, FIG. 25, and FIG. 28 taken along a line A1-A2, respectively.
Figure 12:
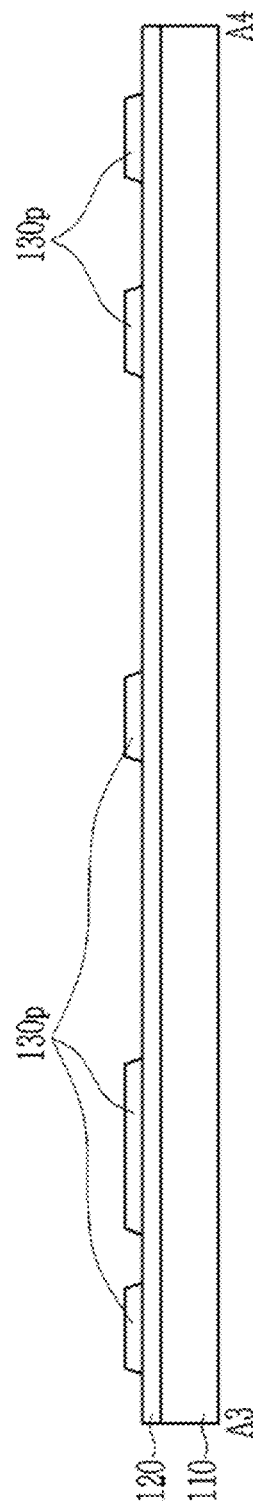
FIG. 12, FIG. 15, FIG. 18, FIG. 21, FIG. 24, FIG. 27, and FIG. 30 are cross-sectional views of a display device in intermediate process steps shown in FIG. 10, FIG. 13, FIG. 16, FIG. 19, FIG. 22, FIG. 25, and FIG. 28 taken along a line A3-A4, respectively.

Referring to FIG. 10 to FIG. 12, an inorganic insulating material and/or an organic insulating material may be deposited on the substrate 110 to form the buffer layer 120. A semiconductor material such as the polysilicon is deposited and patterned on the buffer layer 120 to form a semiconductor pattern 130p. The patterning process may include a photolithography process forming a mask pattern through exposure and developing using a photomask for etching. The entire plane shape of the semiconductor pattern 130p may be the same as the plane shape of the above-described active pattern 130.

Figure 13:
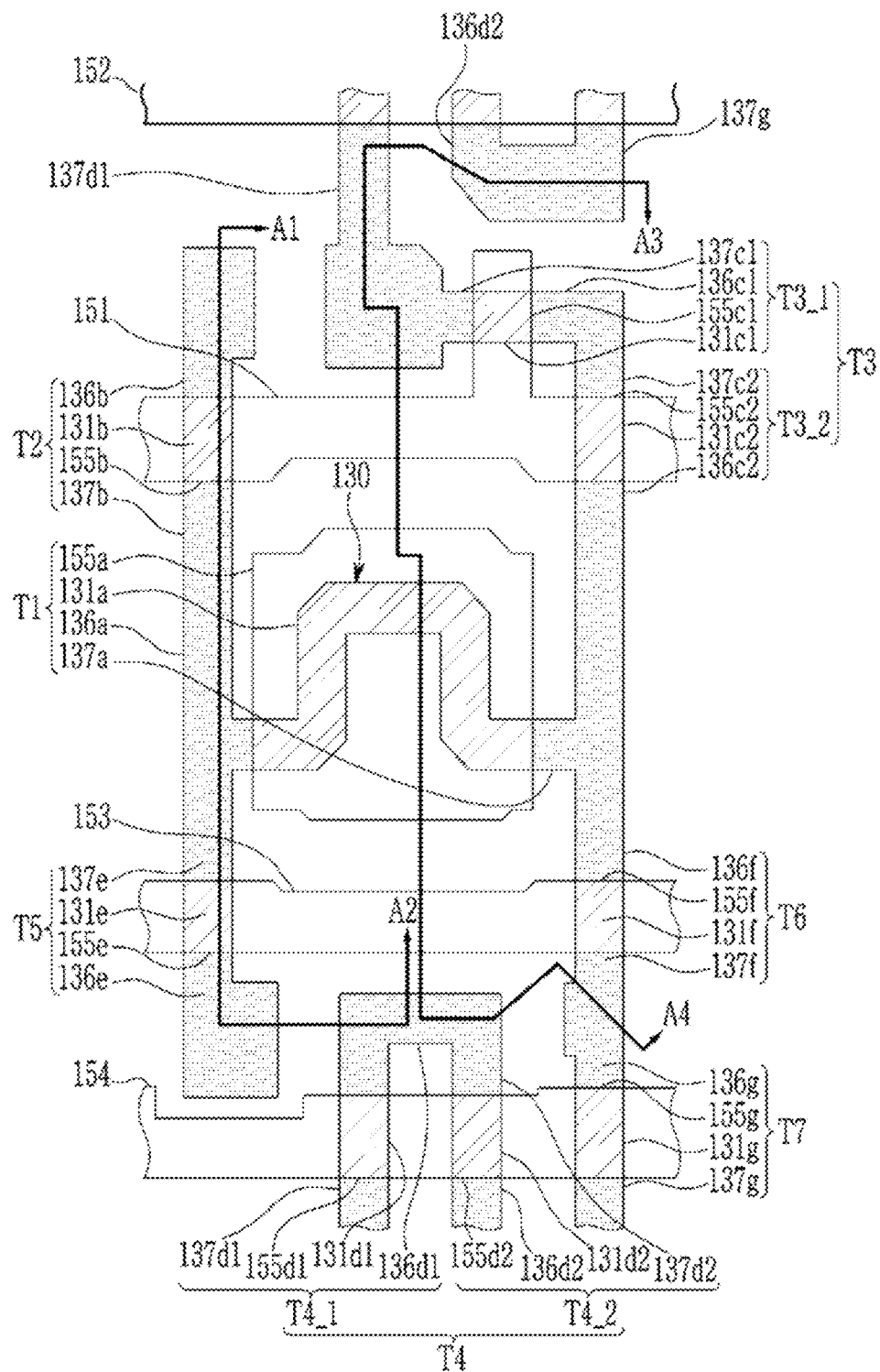
Figure 14:
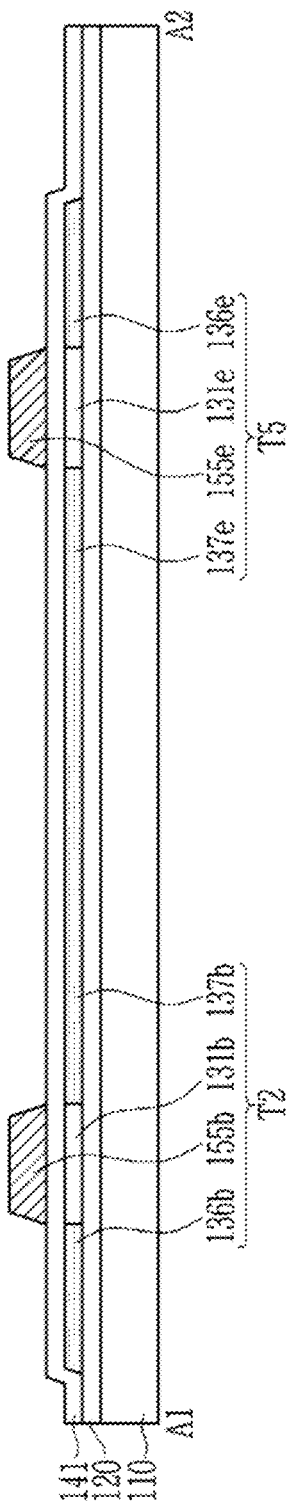
Figure 15:
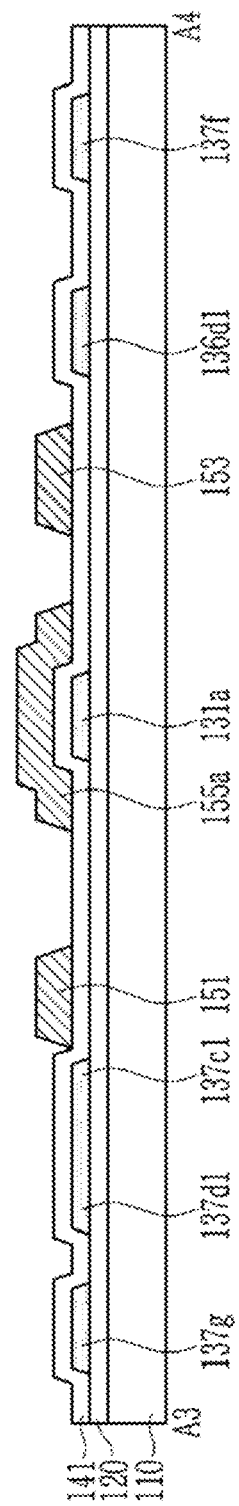

Referring to FIG. 13 to FIG. 15, an inorganic insulating material such as a silicon nitride, a silicon oxide, and/or the organic insulating material may be deposited on the semiconductor pattern 130p (see, e.g., FIG. 10 to FIG. 12) to form a first insulating layer 141, and a conductive material such as copper (Cu), aluminum (Al), molybdenum (Mo), titanium (Ti), tantalum (Ta), or alloys of at least two among them, may be deposited and patterned on the first insulating layer 141 to form a first conductive layer including scan lines 151, 152, and 154, a control line 153, and a driving gate electrode 155a.

An N-type or P-type impurity may be doped to the semiconductor pattern 130p by using the first conductive layer as a mask to form an active pattern 130 including a plurality of channel regions 131a, 131b, 131c1, 131c2, 131d1, 131d2, 131e, 131f, and 131g and a conductive region. Thus, as described above, a plurality of transistors T1, T2, T3, T4, T5, T6, and T7 may be formed.

Figure 16:
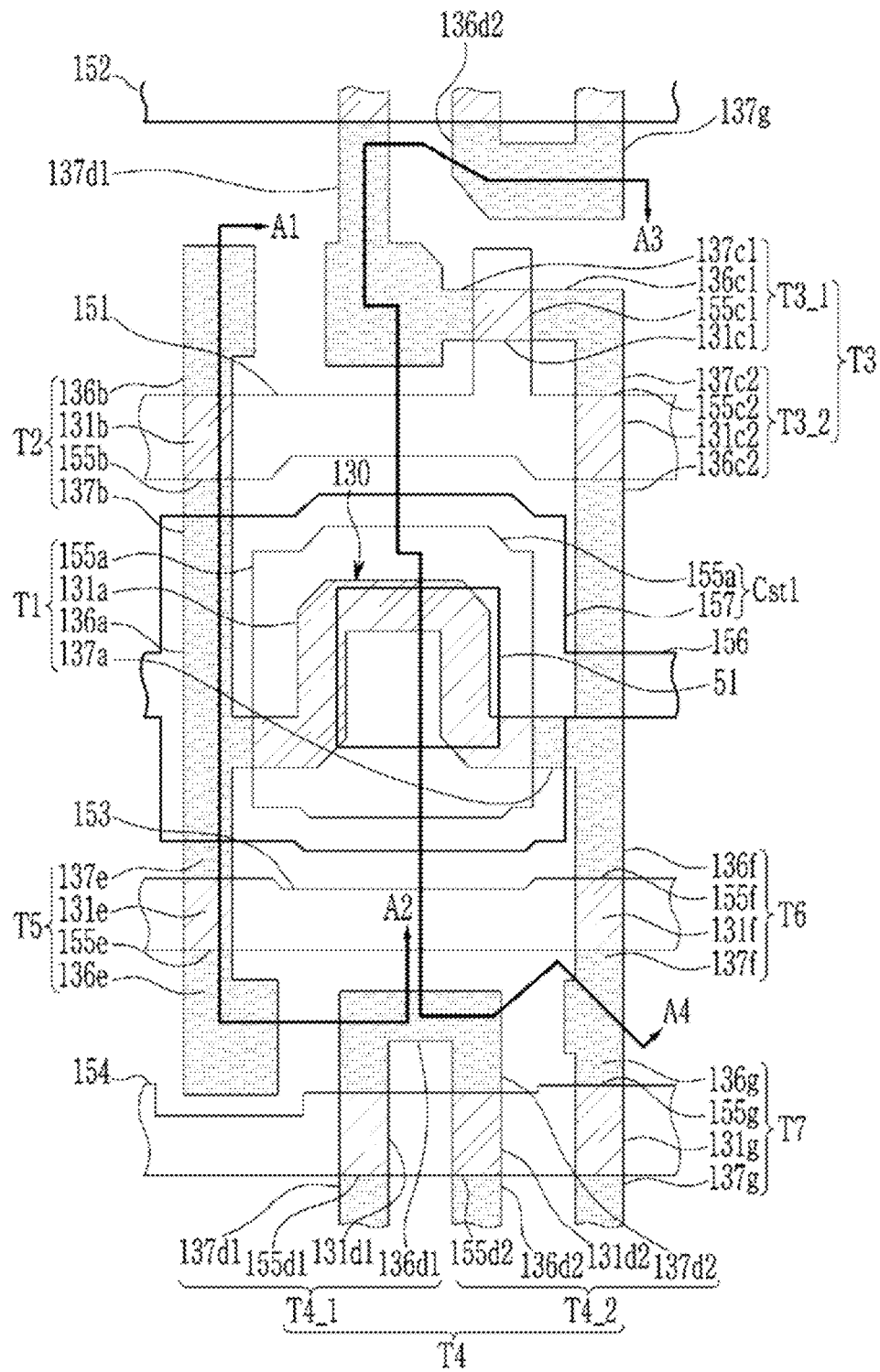
Figure 17:
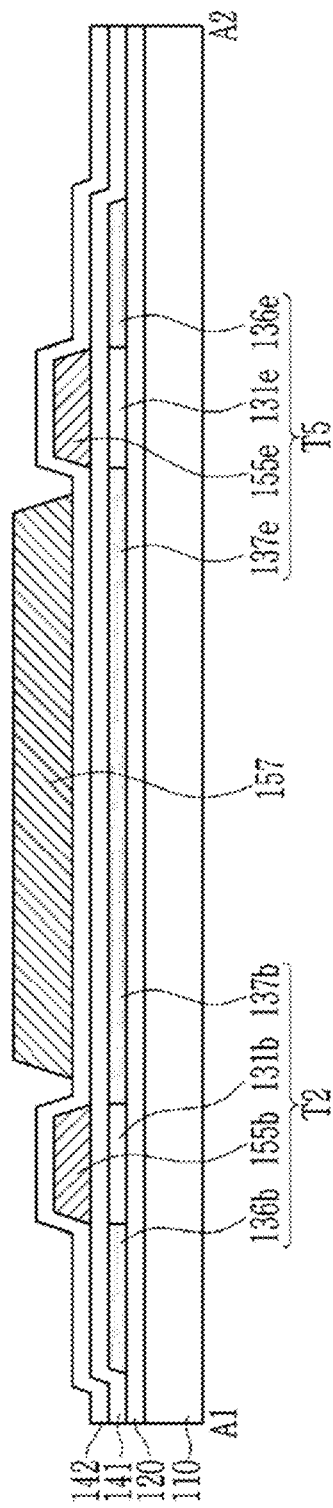
Figure 18:
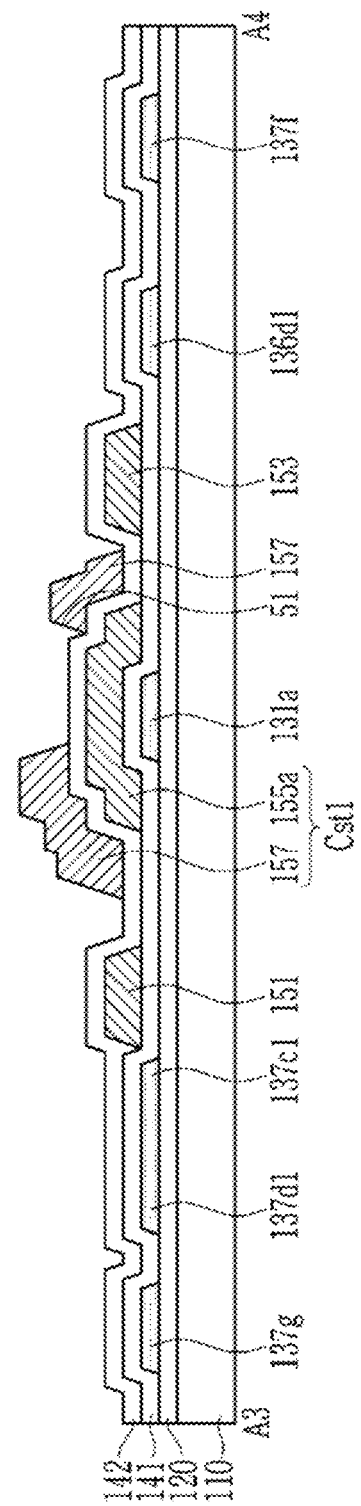

Referring to FIG. 16 to FIG. 18, the inorganic insulating material such as the silicon nitride, the silicon oxide, and/or the organic insulating material may be deposited on the first insulating layer 141 and the first conductive layer to form the second insulating layer 142, and the conductive material such as copper (Cu), aluminum (Al), molybdenum (Mo), titanium (Ti), tantalum (Ta), or alloys of at least two among them, may be deposited and patterned on the second insulating layer 142 to form a second conductive layer including an expansion 157 and a storage line 156 having an opening 51.

Figure 19:
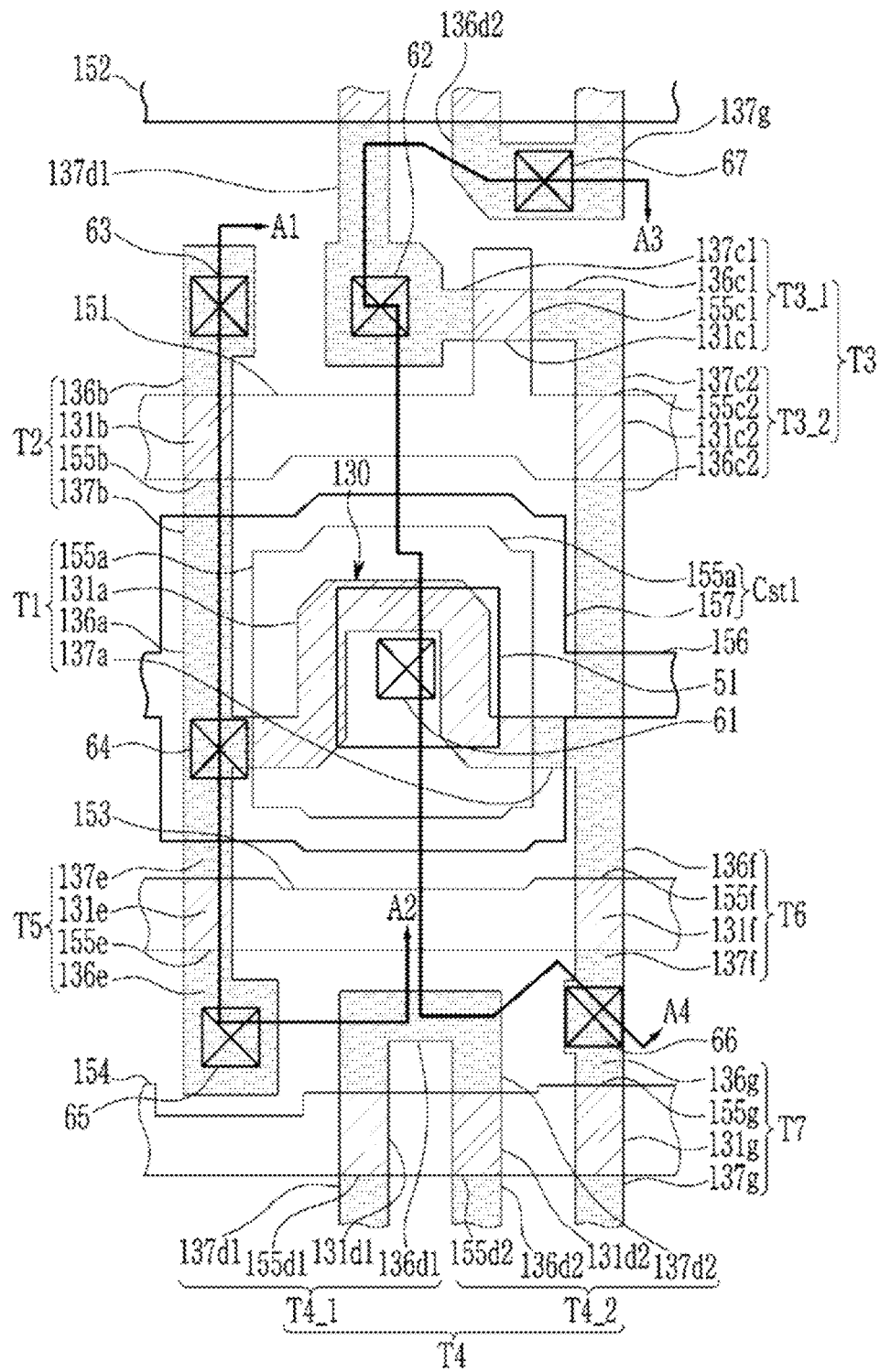
Figure 20:
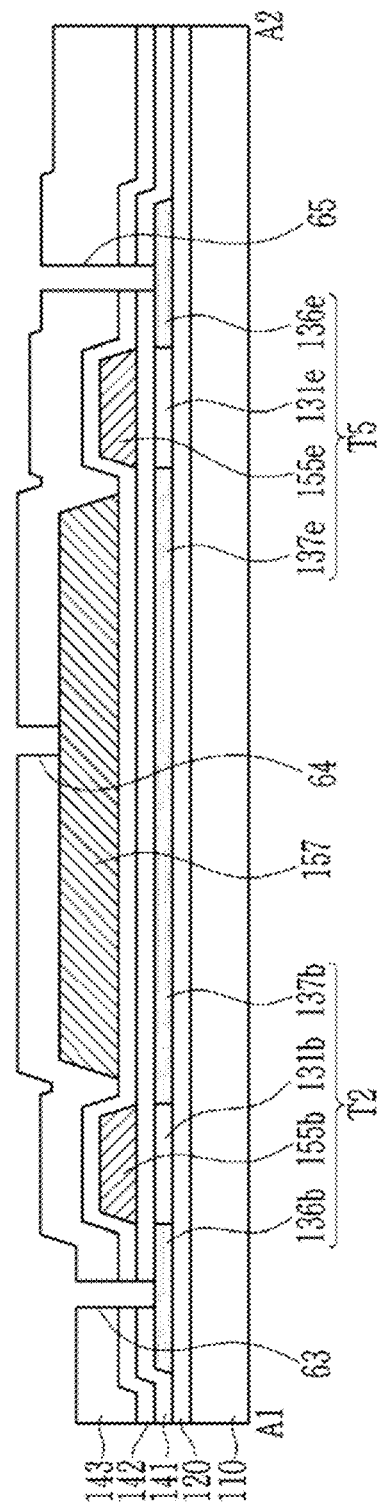
Figure 21:
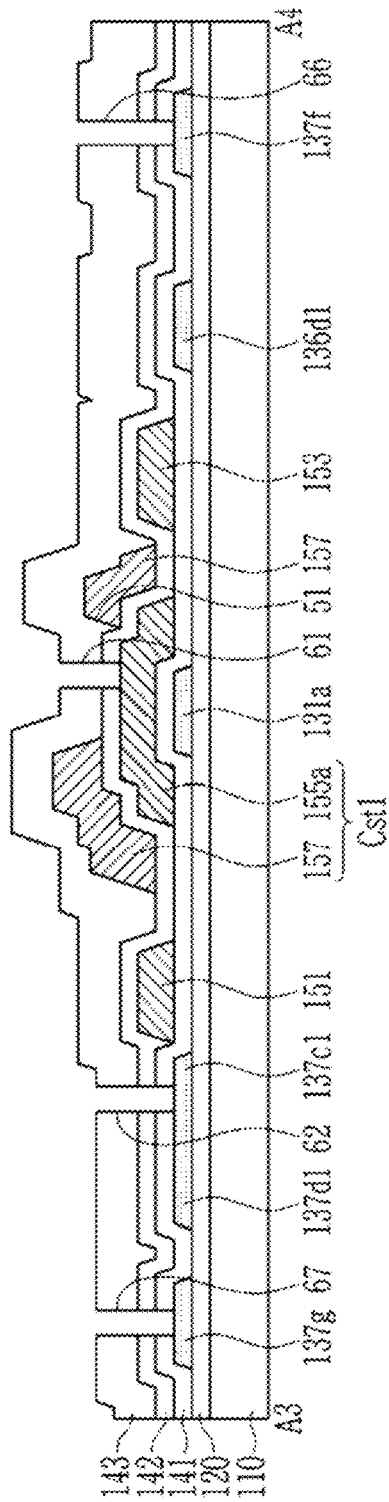

Referring to FIG. 19 to FIG. 21, an inorganic insulating material such as silicon nitride, silicon oxide, and/or organic insulating material may be deposited on the second insulating layer 142 and the second conductive layer to form the third insulating layer 143. The first insulating layer 141, the second insulating layer 142, and the third insulating layer 143 may be patterned by a photo-process to form a plurality of contact holes 61, 62, 63, 64, 65, 66, and 67 penetrating some or all of the first insulating layer 141, the second insulating layer 142, and the third insulating layer 143. As described above, since the active pattern 130 of the part where the contact holes 62 and 65 are positioned is expanded may be sufficiently obtained, the contact holes 62 and 65 may have a sufficient process margin to be restrictively formed only on the active pattern 130.

Figure 22:
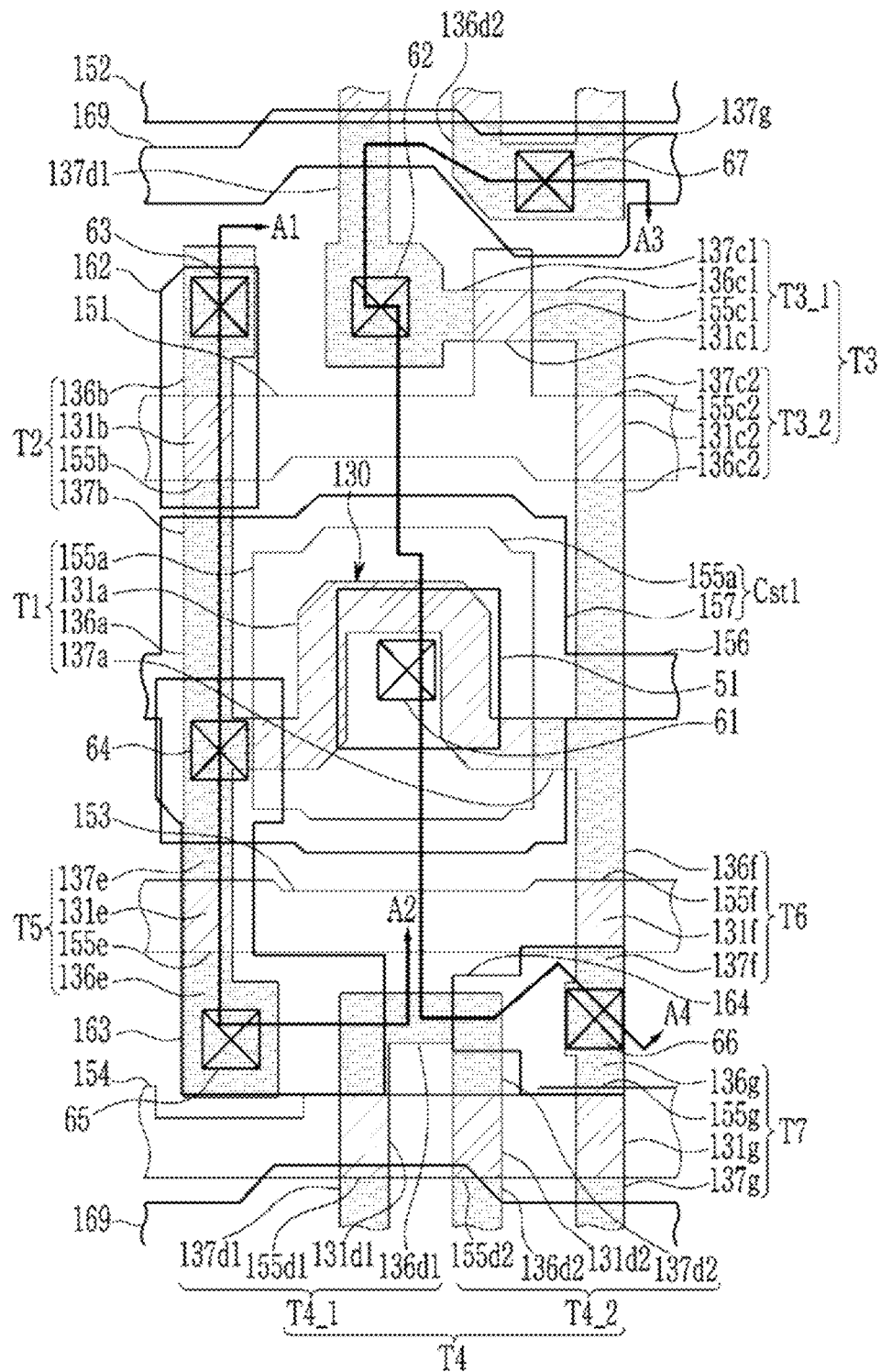
Figure 23:
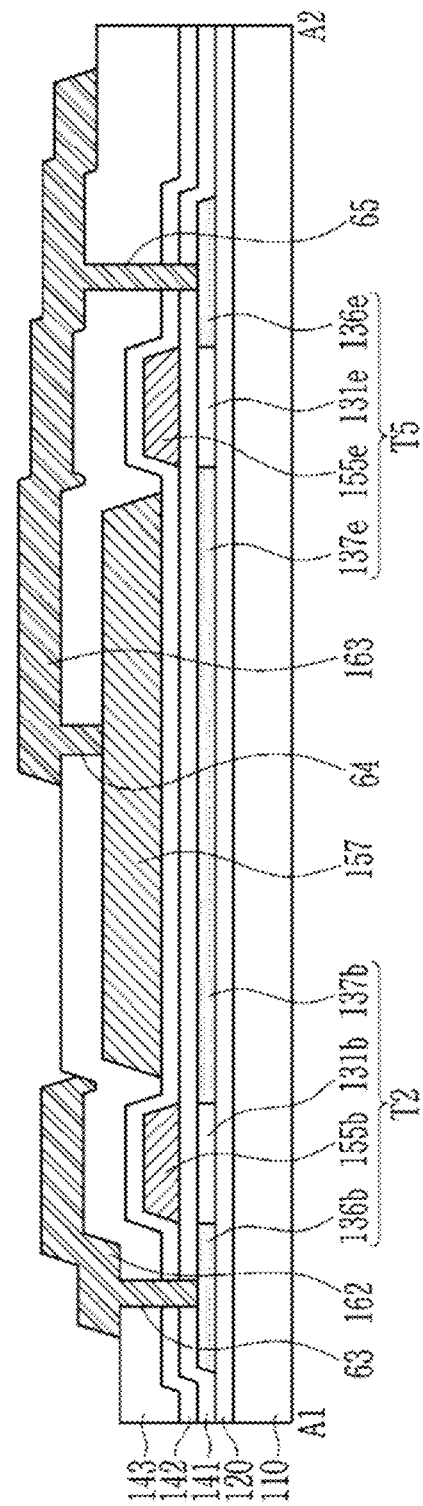
Figure 24:
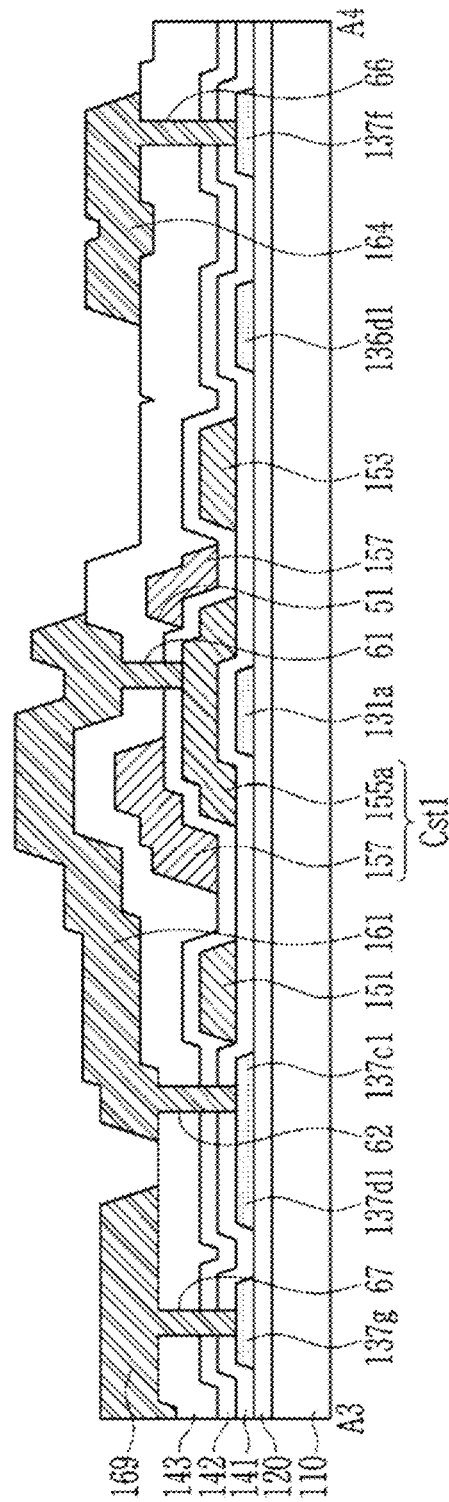

Referring to FIG. 22 to FIG. 24, the conductive material such as copper (Cu), aluminum (Al), molybdenum (Mo), titanium (Ti), tantalum (Ta), or alloys of at least two among them, may be deposited and patterned on the third insulating layer 143 to form a third conductive layer including the initialization voltage line 169 and a plurality of connectors 161, 162, 163, and 164.

Figure 25:
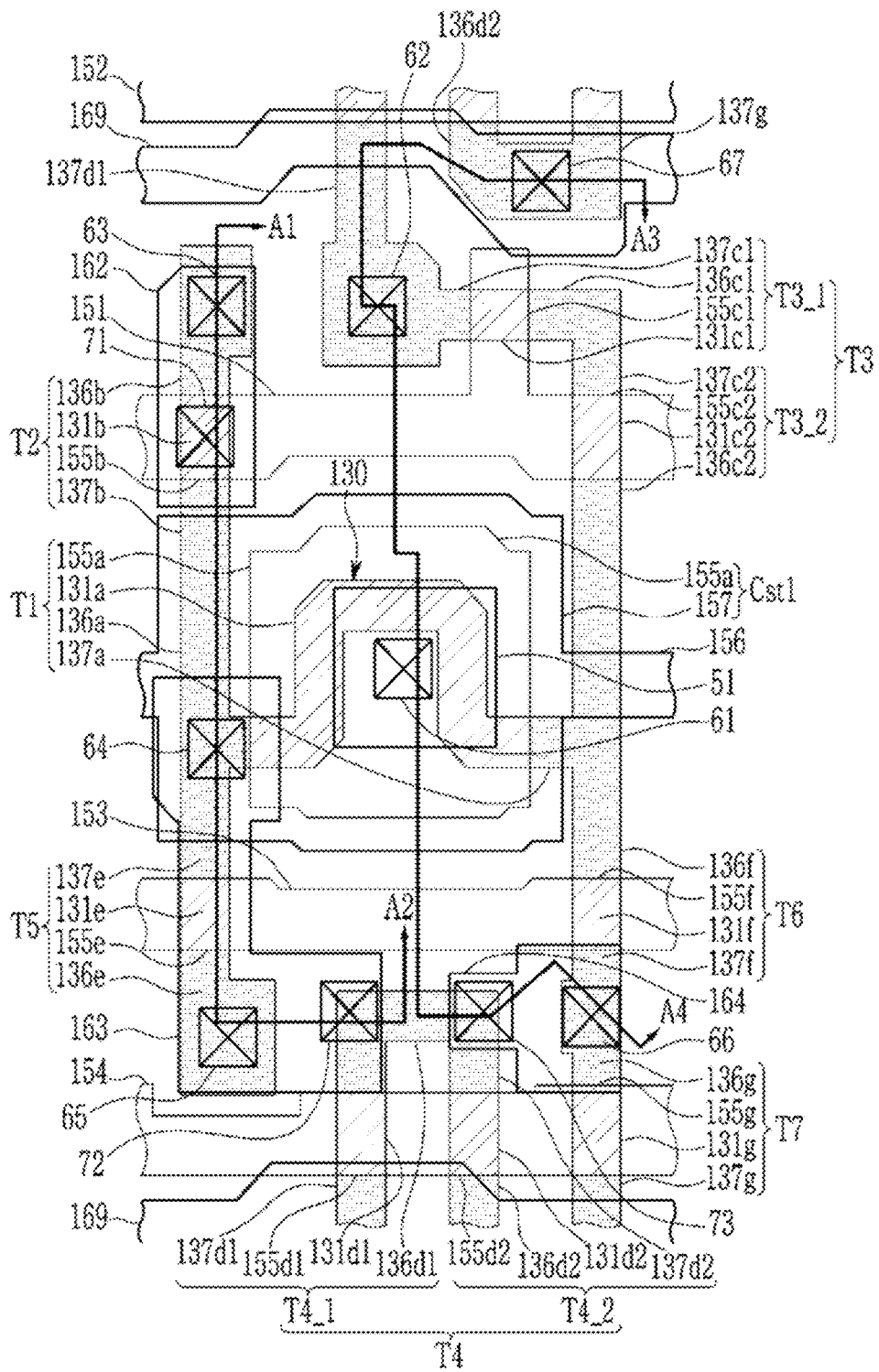
Figure 26:
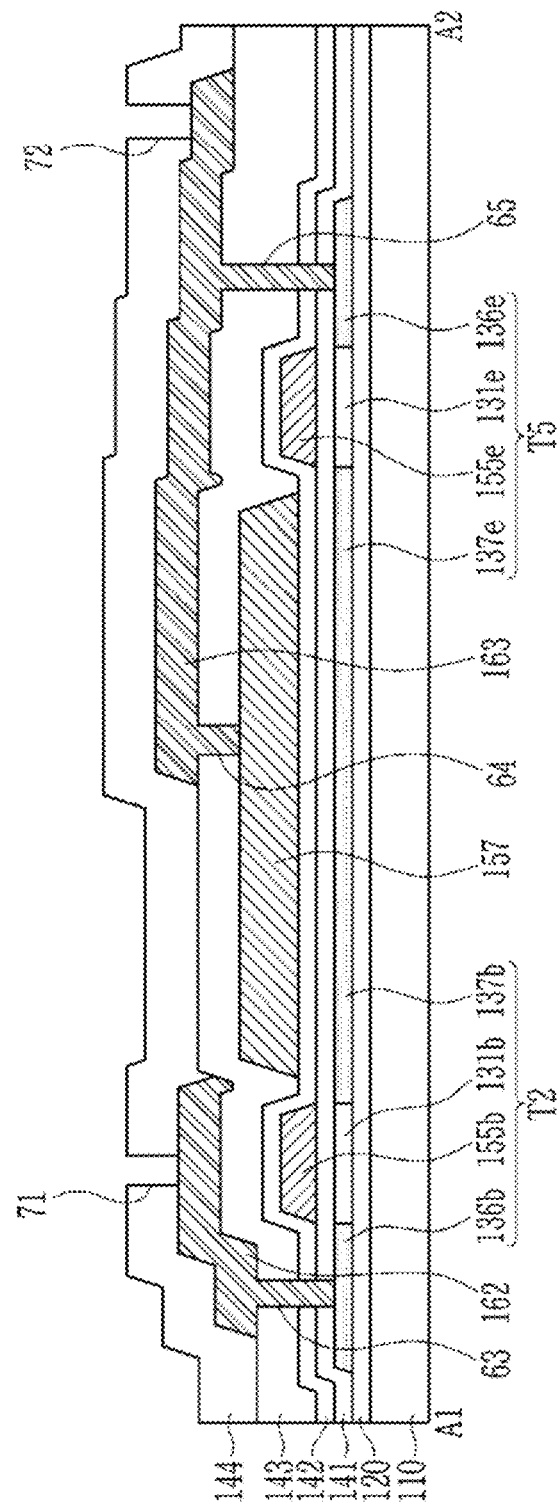
Figure 27:
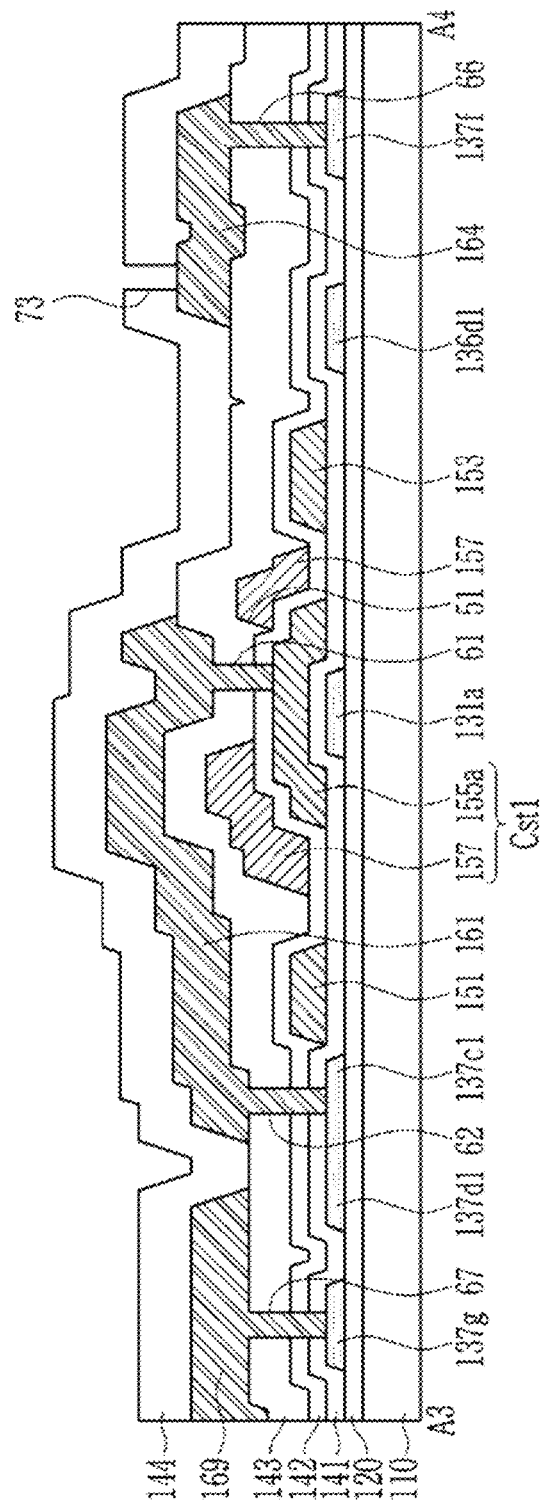

Referring to FIG. 25 to FIG. 27, an inorganic insulating material such as a silicon nitride, a silicon oxide, and/or an organic insulating material may be deposited on the third insulating layer 143 and the third conductive layer to form the fourth insulating layer 144. The fourth insulating layer 144 may be patterned by the photo-process to form a plurality of contact holes 71, 72, and 73.

Figure 28:
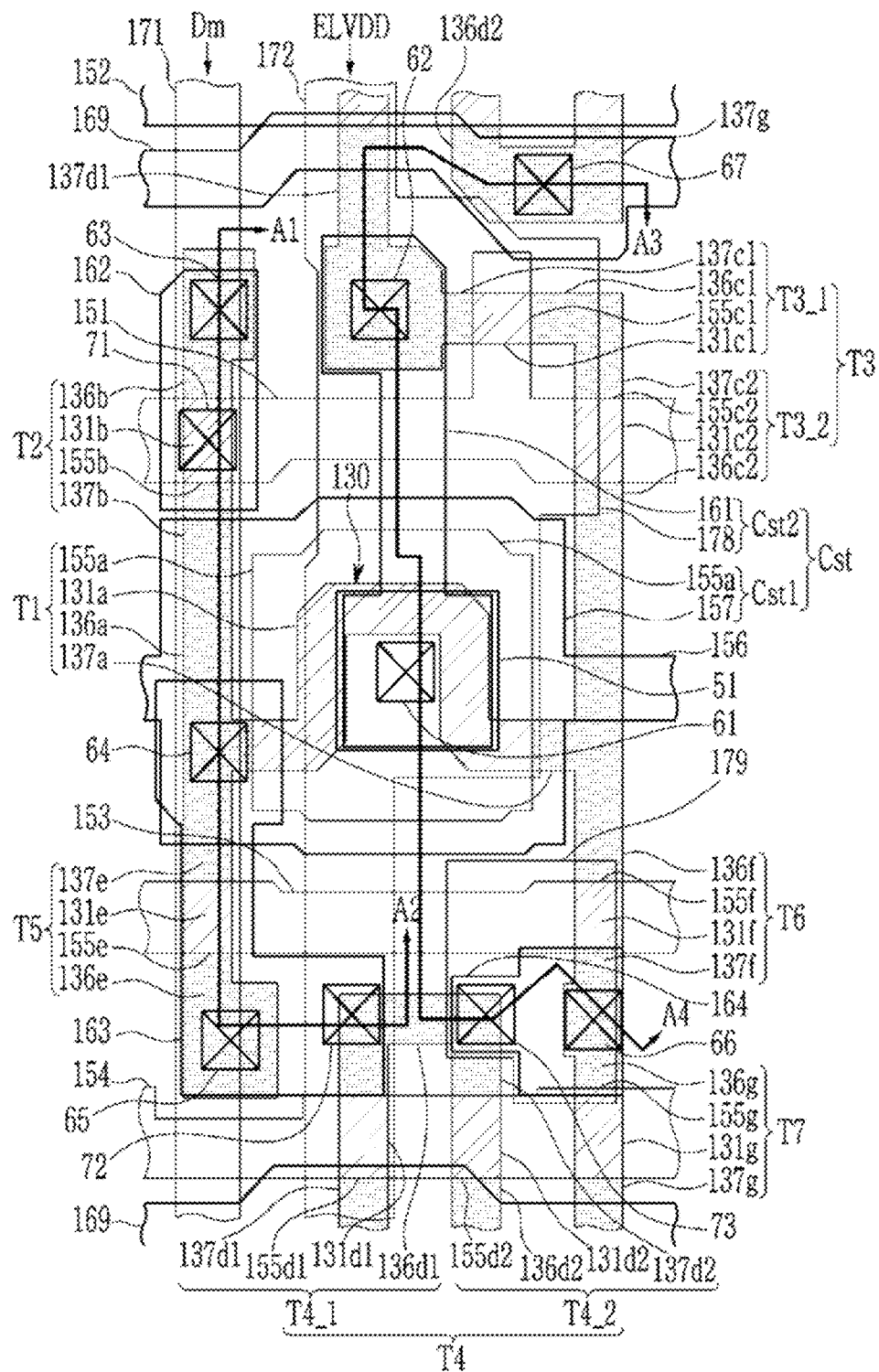
Figure 29:
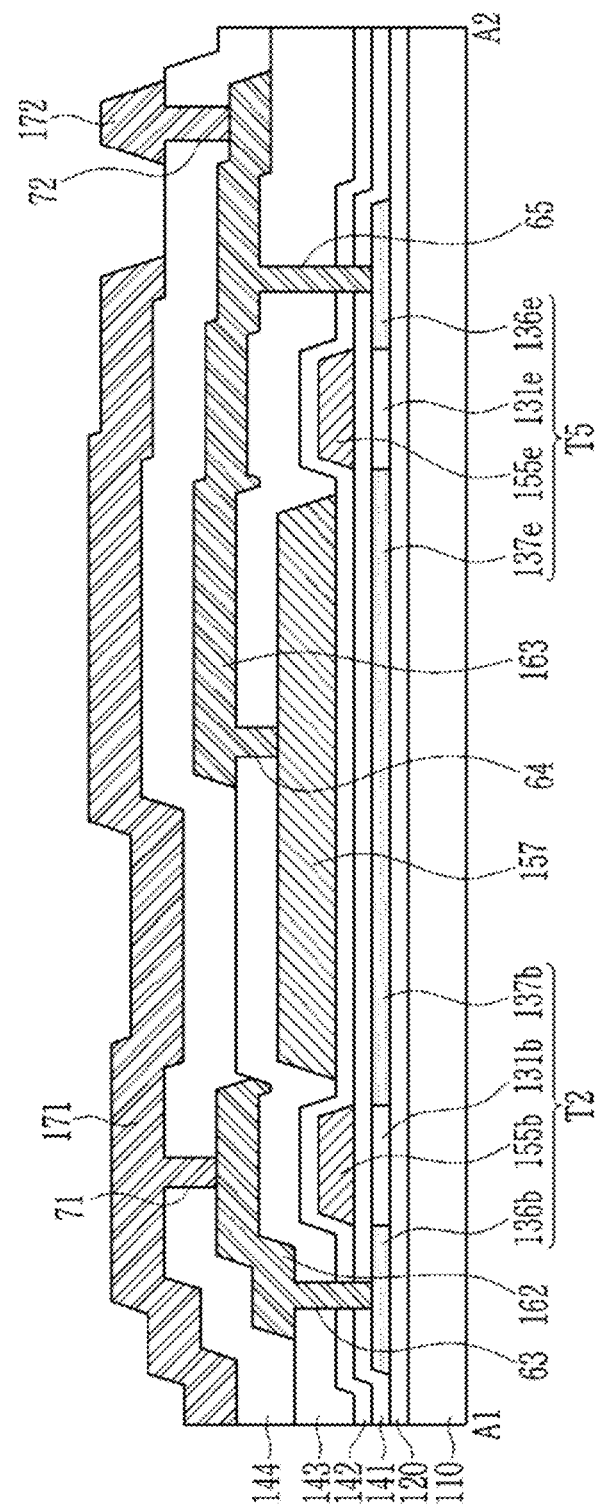
Figure 30:
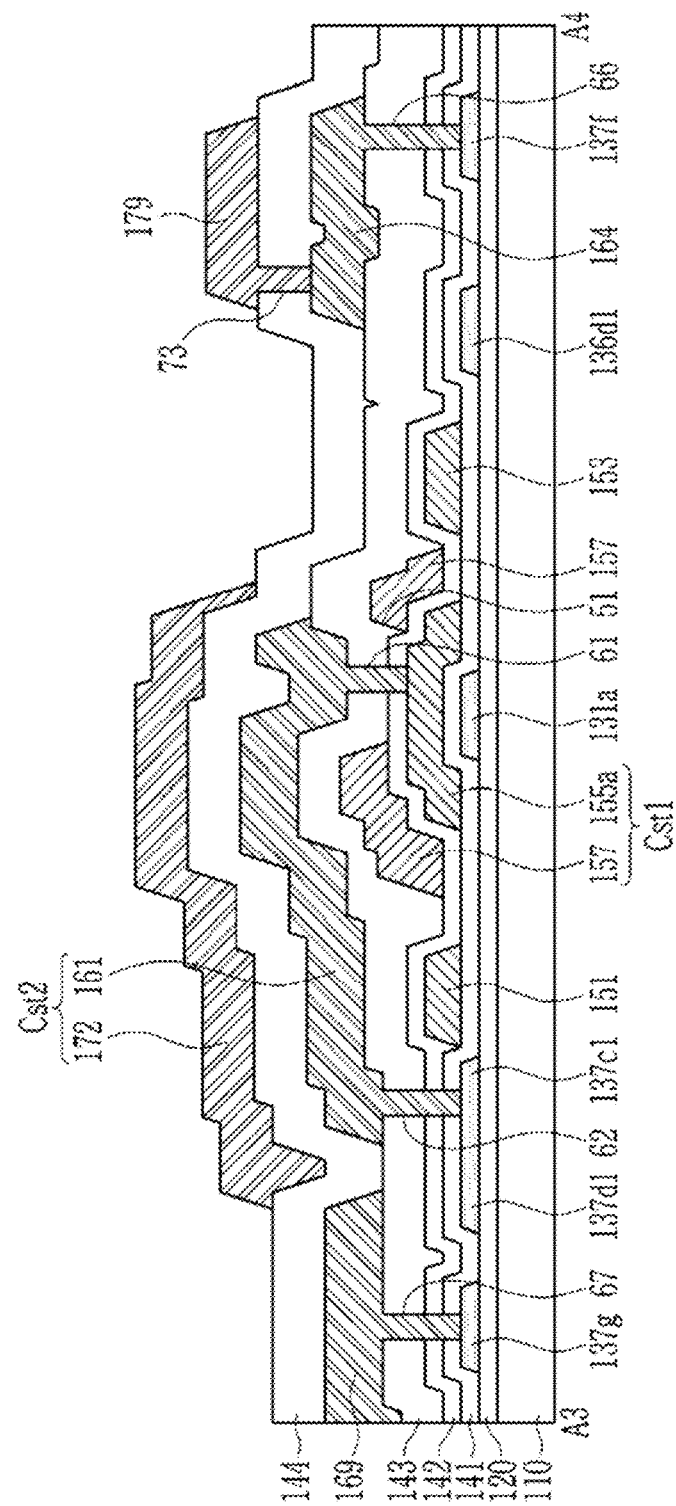

Referring to FIG. 28 to FIG. 30, a conductive material such as copper (Cu), aluminum (Al), molybdenum (Mo), titanium (Ti), tantalum (Ta), or alloys of at least two among them, may be deposited and patterned on the fourth insulating layer 144 to form a fourth conductive layer including the data line 171, the driving voltage line 172, and the connector 179.

Referring to FIG. 2 to FIG. 4, the passivation layer 180 may be formed by depositing an organic insulating material on the fourth conductive layer and the fourth insulating layer 144. The passivation layer 180 may be patterned to form the contact hole 89 positioned above the connector 179.

A conductive material such as ITO may be deposited on the passivation layer 180 and patterned to form a fifth conductive layer including the pixel electrode 191. The pixel defining layer 350 may be formed on the pixel electrode 191 and the passivation layer 180. An emission layer 370 and the common electrode 270 may be sequentially formed to form a light emitting diode (LED) ED. An encapsulation layer encapsulating the light emitting diode (LED) ED may be formed.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
a substrate;
a first transistor including a first channel region and a first gate electrode over the substrate;
a third transistor including a third channel region, a third gate electrode, and a third conductive region over the substrate;
a storage line including a first expansion over first gate electrode;
a first connector over the storage line, the first connector electrically connecting the first gate electrode of the first transistor to the third conductive region of the third transistor; and
a first conductor disposed over the first connector and transmitting a driving voltage, wherein
the first gate electrode and the first expansion overlaps the first channel region of the first transistor along a direction orthogonal to an upper surface of the substrate, and
the first connector and the first conductor overlaps the first channel region of the first transistor and the third conductive region of the third transistor along the direction orthogonal to the upper surface of the substrate.

2. The display device of claim 1, wherein
a planar area of the first expansion is larger than a planar area of the first gate electrode.

3. The display device of claim 2, wherein
a planar area of the first conductor is larger than a planar area of the first connector.

4. The display device of claim 1, wherein
the first conductor further overlaps at least a portion of the third channel region of the third transistor along the direction orthogonal to the upper surface of the substrate.

5. The display device of claim 1, wherein
the first connector and the first conductor overlaps the first gate electrode and the first expansion along the direction orthogonal to the upper surface of the substrate.

6. The display device of claim 1, wherein
the first gate electrode and the first expansion form a first sub-capacitor, and
the first connector and the first conductor form a second sub-capacitor.

7. The display device of claim 6, wherein
the first sub-capacitor overlaps a portion of the second sub-capacitor along the direction orthogonal to the upper surface of the substrate.

8. The display device of claim 6, further comprising:
a light-emitting element over the second sub-capacitor.

9. The display device of claim 6, further comprising
a scan line extending substantially in a first direction; and
a driving voltage line including the first conductor.

10. The display device of claim 9, wherein
a planar region of the second sub-capacitor extends in a second direction crossing the first direction.

11. The display device of claim 9, further comprising:
a fourth transistor including a fourth channel region, a fourth gate electrode, and a fourth conductive region electrically connected to the first connector, wherein
the driving voltage line overlaps the fourth channel region.

12. The display device of claim 1, wherein
the first gate electrode, the first expansion, the first connector, and the first conductor are sequentially arranged above the substrate, the first gate electrode and the first connector transmit substantially a same voltage, and the first conductor and the first expansion transmit substantially a same voltage.

13. The display device of claim 1, wherein the first expansion has an opening, and the first connector is electrically connected to the first gate electrode in the opening.

14. The display device of claim 1, further comprising:

a first insulating layer between the first gate electrode and the first channel region;

a second insulating layer between the first gate electrode and the first expansion;

a third insulating layer between the first expansion and the first connector; and a fourth insulating layer above the first connector.

* * * * *